US011852575B2

(12) United States Patent
Kawamuro et al.

(10) Patent No.: US 11,852,575 B2
(45) Date of Patent: Dec. 26, 2023

(54) STATE DETERMINATION APPARATUS, STATE DETERMINATION METHOD, AND STORAGE MEDIUM

(71) Applicant: HIOKI E.E. CORPORATION, Ueda (JP)

(72) Inventors: Yuki Kawamuro, Ueda (JP); Akihiro Shioiri, Ueda (JP); Naoto Nakayama, Ueda (JP)

(73) Assignee: HIOKI E.E. CORPORATION, Ueda (JP)

( * ) Notice: Subject to any disclaimer, the term of this patent is extended or adjusted under 35 U.S.C. 154(b) by 21 days.

(21) Appl. No.: 17/393,948

(22) Filed: Aug. 4, 2021

(65) Prior Publication Data

US 2022/0042897 A1    Feb. 10, 2022

(30) Foreign Application Priority Data

Aug. 5, 2020   (JP) .................................. 2020-133419

(51) Int. Cl.
*G01N 15/04*    (2006.01)
*G01N 27/07*    (2006.01)
(Continued)

(52) U.S. Cl.
CPC ............. *G01N 15/04* (2013.01); *G01N 27/07* (2013.01); *G01N 27/228* (2013.01); *H01M 10/0525* (2013.01)

(58) Field of Classification Search
CPC ...... G01N 15/04; G01N 27/07; G01N 27/228; G01N 27/026; G01N 27/02;
(Continued)

(56) References Cited

U.S. PATENT DOCUMENTS

2005/0032235 A1*   2/2005   Tummala .............. G01N 21/65
                                                    436/171
2006/0265150 A1*  11/2006   Hu ..................... G01N 33/2823
                                                    702/50
(Continued)

FOREIGN PATENT DOCUMENTS

EP            3045467 A1 *   7/2016    .............. C07K 1/24
JP         2012052944 A  *   3/2012    .............. G01N 27/22

OTHER PUBLICATIONS

"Determination of particle size distribution by gravitational liquid sedimentation methods—Part 1: General principles and guidelines," Japanese Industrial Standards No. JIS Z8820-1:2002, Jul. 20, 2002, 16 pages including English explanation, Japanese Standards Association, Japan.

(Continued)

*Primary Examiner* — Alexander Satanovsky
*Assistant Examiner* — Asm Fakhruddin
(74) *Attorney, Agent, or Firm* — Jordan IP Law, LLC

(57) ABSTRACT

A state determination apparatus includes: electrodes configured to apply AC signal to a mixture; a measurement unit configured to measure an impedance of the mixture for every frequency of the AC signal based on a response signal flowing through the mixture when the AC signal is applied; a setting unit configured to set an equivalent circuit including one or a plurality of parallel circuit(s) based on element(s) corresponding to electrical component(s) of a solid matter; a calculating unit configured to calculate a parameter of the parallel circuit by executing an equivalent circuit analysis for approximating impedance of the equivalent circuit to the impedance of the mixture; and a derivation unit configured to derive an index for specifying a state of the mixture based on the parameter of the parallel circuit.

15 Claims, 12 Drawing Sheets

(51) Int. Cl.
G01N 27/22 (2006.01)
H01M 10/0525 (2010.01)

(58) Field of Classification Search
CPC . H01M 10/0525; G01R 31/389; G01R 27/02; Y02E 60/10
See application file for complete search history.

(56) References Cited

U.S. PATENT DOCUMENTS

| | | | | |
|---|---|---|---|---|
| 2011/0020711 A1* | 1/2011 | Okano | ................. | H01M 4/502 |
| | | | | 429/340 |
| 2013/0030736 A1* | 1/2013 | Tanaka | ................. | G01R 31/392 |
| | | | | 702/63 |
| 2014/0287287 A1* | 9/2014 | Osaka | ................. | H01M 10/613 |
| | | | | 324/430 |
| 2018/0233772 A1 | 8/2018 | Sasaki et al. | | |
| 2019/0331737 A1* | 10/2019 | Kodama | ............ | H01M 10/4285 |
| 2020/0003730 A1* | 1/2020 | Winecki | ................ | G01N 33/241 |
| 2020/0185697 A1 | 6/2020 | Kim et al. | | |
| 2020/0212492 A1 | 7/2020 | Collins et al. | | |

OTHER PUBLICATIONS

"Determination of particle size distribution by centrifugal liquid sedimentation methods—Part 1: General principles and guidelines," Japanese Industrial Standards No. JIS Z8823-1:2001, Apr. 20, 2001, 12 pages including English explanation, Japanese Standards Association, Japan.

Wang Zhilong et al: "Evaluation of particle dispersion behaviors in Lithium-ion battery slurry by electrical impedance spectra-tomography method", Transactions of the Institute of Measurement and Control., vol. 42, No. 4, Jul. 15, 2019.

* cited by examiner

INTERNAL RESISTANCE COMPONENT
$(R_{ix}, C_{ix}), (R_{iy}, C_{iy}), (R_{iz}, C_{iz})$
CONTACT RESISTANCE COMPONENT
$R_{i\text{-}j}, C_{i\text{-}j}$

STATE DETERMINATION APPARATUS, STATE DETERMINATION METHOD, AND STORAGE MEDIUM

CROSS-REFERENCE TO RELATED APPLICATION

The present application claims priority under 35 U.S.C. § 119 to Japanese Patent Application 2020-133419 (filed on Aug. 5, 2020), which is hereby incorporated by reference in its entirety.

TECHNICAL FIELD

The present invention relates to a state determination apparatus that determines a state of a mixture in which insoluble solid matters are mixed in liquid, a method of determining the state, and a storage medium that stores a program that causes a computer to execute the determination of the state of the mixture.

BACKGROUND ART

In an industrial field, a mixture into which insoluble particulate solid matters are mixed is used in order to, for example, create new functions by compositing materials having different physical characteristic, in order to achieve modification of shapes, refinement, shaping, or the like of the materials.

Recently, in fields of electronic components, etc., for example, there are increasing demands for higher-functionality and higher-performance. Therefore, there are demands for achieving a strict management also on a quality of the mixture used for the electronic components on the basis of specific evaluation indices.

As a method for determining a particle diameter distribution of particles contained in a mixture, a sedimentation method has been known. This sedimentation method includes a gravitational liquid sedimentation method (Japan Industrial Standard JIS Z8820-1:2002) that utilizes the natural gravity and a centrifugal liquid sedimentation method (Japan Industrial Standard JIS Z8823-1:2001) that utilizes the centrifugal force.

In a sedimentation test according to the above-described sedimentation method, a measurer performs an observation of a change in a height of a boundary between a supernatant liquid layer and a particle layer, which has been formed by sedimentation over an elapsed time, and a change in a state such as a clarity/turbidity state of the supernatant liquid layer by charging the mixture into a sedimentation tube. The particle diameter distribution of the mixture is determined based on these changes.

SUMMARY OF INVENTION

With the above-described sedimentation test, it takes a long time until the sedimentation of the particles in mixture is stabilized, and in addition, the measurers are required to perform the observation of the mixture. Therefore, for the measurers, the work for obtaining an index for specifying the state of the mixture is complicated, and it is not easy to perform the observation.

The present invention has been conceived in light of the above-described problem, and an object thereof is to derive an index for specifying a state of a mixture with ease.

A state determination apparatus as an aspect of the present invention is a state determination apparatus configured to determine a state of a mixture in which an insoluble solid matter is mixed in liquid, the state determination apparatus including: electrodes configured to apply AC signal to the mixture; a measurement unit configured to measure an impedance of the mixture for every frequency of the AC signal based on a response signal flowing through the mixture when the AC signal is applied; a setting unit configured to set an equivalent circuit including one or a plurality of parallel circuit(s) based on element(s) corresponding to electrical component(s) of the solid matter; a calculating unit configured to calculate a parameter of the parallel circuit(s) by executing an equivalent circuit analysis for approximating impedance of the equivalent circuit to the impedance of the mixture; and a derivation unit configured to derive an index for specifying the state of the mixture based on the parameter of the parallel circuit(s).

According to an aspect of the present invention, because the index for specifying the state of the mixture can be derived from the impedance of the measured mixture by using the equivalent circuit including the parallel circuit based on the element corresponding to the electrical component of the solid matter, it is possible to easily derive the index for specifying the state of the mixture.

DESCRIPTION OF EMBODIMENTS

[Description of State Determination Apparatus]

A state determination apparatus 1 according to an embodiment of the present invention will be described in detail by using FIGS. 1 and 2.

Figure 1:
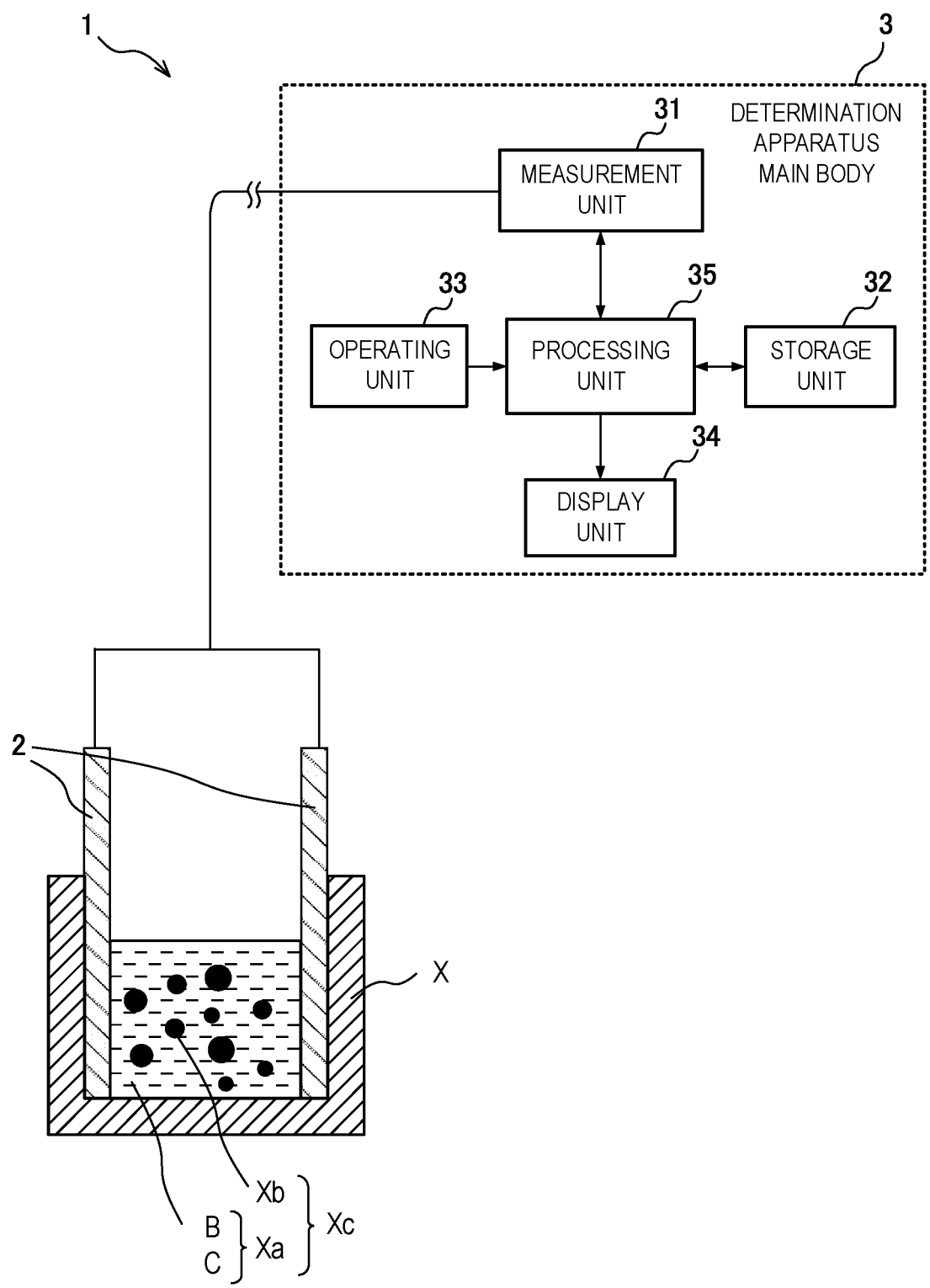
FIG. 1 is a schematic view showing a configuration of a state determination apparatus according to an embodiment of the present invention.

FIG. 1 is a schematic view showing a configuration of the state determination apparatus 1 according to this embodiment.

The state determination apparatus 1 is an apparatus for evaluating a slurry Xc that is one of mixtures stored in a tank X. The slurry Xc is formed by mixing an insoluble solid matter Xb (hereinafter, referred to as an active material Xb) into liquid Xa.

In this embodiment, the slurry Xc is, as an example, a slurry used for positive electrodes or negative electrodes of lithium ion batteries. In this embodiment, the slurry Xc is formed by dispersing a conductive auxiliary agent C with a high conductivity into a solvent containing a binder resin B and the active material Xb.

In other words, the slurry Xc contains, as the solid matter, the active material Xb, the binder resin B, and the conductive auxiliary agent C. The relation of the conductivities of these elements satisfies, in general, the conductive auxiliary agent C>the active material Xb>the binder resin B.

In the state determination apparatus 1, AC signal is applied to the slurry Xc, and during which, an impedance of the slurry Xc is measured on the basis of a response signal flowing through the slurry Xc. Furthermore, in the state determination apparatus 1, the state of the slurry Xc is derived by setting the equivalent circuit for the slurry Xc and by executing an equivalent circuit analysis such that the impedance of the equivalent circuit approaches a measured result. The state of the slurry Xc derived in this embodiment includes physical characteristic and electric characteristic.

The state determination apparatus 1 is provided with electrodes 2 and a determination apparatus main body 3.

The electrodes 2 are a pair of electrodes for applying AC voltage serving as the AC signal to the slurry Xc stored in the tank X. The pair of electrodes 2 are provided on the peripheral wall of the tank X so as to oppose with each other. The electrodes 2 are formed of, for example, the non-reactive metal such as platinum and copper. Response current serving as the response signal corresponding to the AC voltage applied to the slurry Xc flows between the pair of electrodes 2. The AC signal applied to the slurry Xc is not limited to the AC voltage, and the AC signal may be AC current.

As shown in FIG. 1, the determination apparatus main body 3 includes a measurement unit 31 serving as measurement means, a storage unit 32 serving as storing means, an operating unit 33, a display unit 34, and a processing unit 35 serving as processing means.

The measurement unit 31 measures the impedance of the slurry Xc from the response current that flows when the AC voltage is applied to the slurry Xc located between the pair of electrodes 2. The measurement unit 31 applies the AC voltage to the pair of electrodes 2 in such a manner that the frequency of the AC voltage is changed stepwise. In the above, the AC voltage applied to the pair of electrodes 2 is supplied from a constant-voltage power supply (CV) or a constant-current power supply (CC) that is built into the measurement unit 31. The measurement unit 31 measures the impedance from the response current between the pair of electrodes 2 every time the frequency of the AC voltage is changed stepwise and outputs it to the processing unit 35 as a measurement signal.

The storage unit 32 is formed of a RAM and a ROM. A program for executing a state determining processing for deriving the index for specifying the state of the slurry Xc is stored in the storage unit 32. In other words, the storage unit 32 is a computer-readable storage medium in which an operation program for the processing unit 35 is recorded. The storage unit 32 may be configured so as to be attachable/detachable to/from the measurement apparatus main body 3.

In addition, a frequency characteristic table for the slurry Xc, the state of which is known, is stored in the storage unit 32. The frequency characteristic table shows a correspondence relationship between the frequency of the AC voltage and the measured value of the impedance measured when the AC voltage is applied. Specifically, the measured value of the impedance corresponding to the AC voltage applied to the slurry Xc, the state of which is known, and the frequency of the AC voltage are stored as the frequency characteristic table by being linked with each other.

The operating unit 33 is provided with various operation switches for instructing setting operation of measurement conditions, the start of the state determining processing, and so forth. The operating unit 33 outputs operation signals adapted to these operations to the processing unit 35. Instead of the operation switch that is configured mechanically, a touch panel formed in the display unit 34 may be used as the operating unit 33.

The display unit 34 displays various setting screens, measurement results, and so forth for the measurement of the state of the slurry Xc in accordance with the instruction from the processing unit 35. In this embodiment, the display unit 34 is formed of a liquid crystal panel, etc.

The processing unit 35 controls respective units forming the state determination apparatus 1 in accordance with the operation signals from the operating unit 33. In addition, the processing unit 35 controls the frequency of the AC voltage to be applied to the pair of electrodes 2 and acquires the impedance corresponding to the applied AC voltage. In addition, the processing unit 35 executes the processing for deriving the index for specifying the state of the slurry Xc on the basis of thus acquired impedance.

In this embodiment, the processing unit 35 is formed of a CPU as a computer. The processing unit 35 may also be formed of a plurality of microcomputers.

Next, a functional configuration and operation of the processing unit 35 of the measurement apparatus main body 3 will be described.

Figure 2:
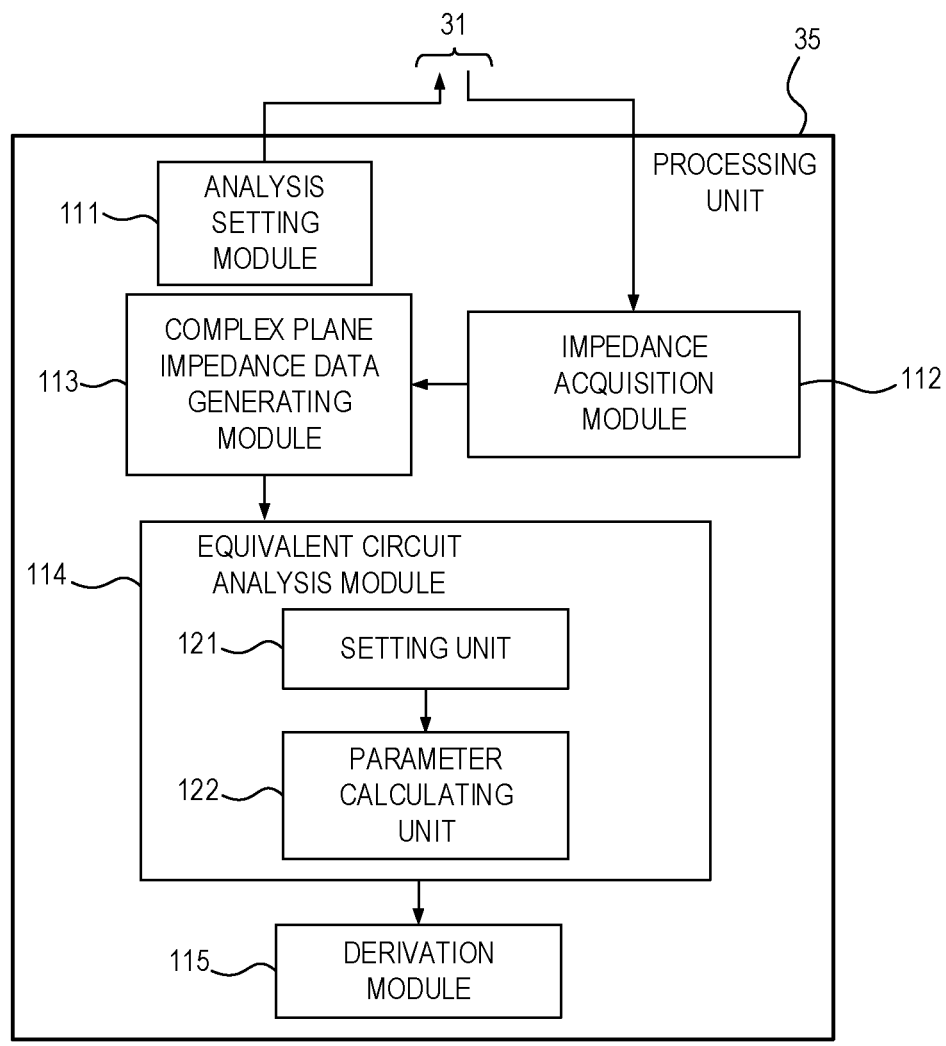
FIG. 2 is a block diagram showing a functional configuration of a processing unit in a determination apparatus main body.

FIG. 2 is a block diagram showing the functional configuration of the processing unit 35 of the determination apparatus main body 3.

The processing unit 35 is provided with an analysis setting module 111, an impedance acquisition module 112, a complex plane impedance data generating module 113, an equivalent circuit analysis module 114, and a derivation module 115. In the following, the complex plane impedance data generating module 113 will simply be referred to as a generating module 113.

The analysis setting module 111 generates a control signal for causing the measurement unit 31 to execute the processing of applying the AC voltage to the electrodes 2 and the processing of measuring the impedance.

The impedance acquisition module 112 acquires the impedance measured by the measurement unit 31. The impedance acquisition module 112 in this embodiment generates measured data indicating imaginary components and real components of the impedance from the impedance based on the response current of the slurry Xc sent from the measurement unit 31 and outputs the measured data to the generating module 113.

The generating module 113 generates a data indicating a complex plane impedance from the measured data indicating imaginary parts and real parts of the impedance acquired from the impedance acquisition module 112 for every frequency of the AC voltage.

In this embodiment, the generating module 113 generates, as the data indicating the complex plane impedance, the complex plane impedance diagram by setting the imaginary part of the measured impedance as a vertical-axis and the real part of the measured impedance as a horizontal axis. The complex plane impedance diagram may be described as a Nyquist diagram.

The generating module 113 outputs the generated complex plane impedance diagram to the equivalent circuit analysis module 114.

The equivalent circuit analysis module 114 executes the equivalent circuit analysis using the equivalent circuit that is formed by combining elements such as a resistor, a capacitor, and so forth.

The equivalent circuit analysis module 114 has a setting unit 121 and a parameter calculating unit 122.

The setting unit 121 sets the equivalent circuit on the basis of resistance component (the impedance) of each of the solid matters (the active material Xb, the binder resin B, and the conductive auxiliary agent C), as the electrical components of the solid matter. In this embodiment, the resistance component further includes a DC resistance component and a capacity component (an AC resistance component).

The setting unit 121 can set, as the resistance component, at least one component of an internal resistance component of the solid matter (the active material Xb, the binder resin B, and the conductive auxiliary agent C) and a mutual contact resistance component between the solid matters. In this embodiment, the setting unit 121 sets the equivalent circuit that includes a series circuit in which a parallel circuit corresponding to the internal resistance component of the solid matter and a parallel circuit corresponding to the contact resistance component between the solid matters are serially connected.

The setting unit 121 uses, as the parallel circuit, at least one of a parallel circuit (R-C) with the resistor and the capacitor and a parallel circuit (R-CPE) with the resistor and a constant phase element (hereinafter, referred to as a CPE) to set the equivalent circuit formed by connecting these parallel circuits.

When a plurality of types of solid matters are mixed in the slurry Xc, the setting unit 121 sets a parallel circuit corresponding to the internal resistance component of the solid matter and the contact resistance component between the solid matters for each of the different types of solid matters and a parallel circuit corresponding to the contact resistance components between mutually different types of the solid matters in respective combinations.

In other words, the setting unit 121 sets, in the equivalent circuit for the slurry Xc: a parallel circuit corresponding to the internal resistance component of the active material Xb serving as a first solid matter; the parallel circuit corresponding to the contact resistance component between the active materials Xb; the parallel circuit corresponding to the internal resistance component of the binder resin B serving as a second solid matter; a parallel circuit corresponding to the contact resistance component between the binder resins B; and a parallel circuit corresponding to the contact resistance component between the active material Xb and the binder resin B.

In addition, the setting unit 121 can also set similar parallel circuits between the active material Xb and the conductive auxiliary agent C and between the binder resin B and the conductive auxiliary agent C.

In this embodiment, the equivalent circuit for the slurry Xc is set on the basis of the resistance component of each of the active material Xb, the binder resin B, and the conductive auxiliary agent C. Here, the resistance component includes: the internal resistance component of each of the active material Xb, the binder resin B, and the conductive auxiliary agent C; the contact resistance component between the matters of the same type; and the contact resistance component between matters of mutually different types. When there are three types of the solid matters, the upper limit of the total number of the resistance components, in other words, the upper limit of the total number of the parallel circuits set in the equivalent circuit is nine.

Depending on the required accuracy of the derivation result, the setting unit 121 can set the number of the parallel circuits to be equal to or less than the number of all resistance components of the solid matter. The number of the parallel circuits may be limited to the number of the resistance components of the solid matters corresponding to the applied AC voltage within a range of the changing frequency of the AC voltage.

The parameter calculating unit 122 executes the equivalent circuit analysis such that the impedance of the equivalent circuit set by the setting unit 121 approximates the impedance of the mixture measured by the measurement unit 31, and calculates the respective parameters of the parallel circuits forming the set equivalent circuit.

The respective parameters of the parallel circuits to be calculated include a resistance value of the resistor, an electrostatic capacitance of the capacitor, a parameter of the constant phase element (CPE), and so forth. For example, when an R-C circuit is used as a unit element, the parameters of the parallel circuits are the resistance value of the resistor R and the electrostatic capacitance of a capacitor C. In addition, when an R-CPE circuit is used as one of the elements, the parameters of the parallel circuits include a CPE constant T, a CPE index p, and so forth, which will be described later.

When the CPE is applied to the equivalent circuit for the slurry Xc, the equivalent circuit analysis module 114 generates an initial impedance characteristic data indicating the frequency characteristics of the real part and the imaginary part of the impedance of the equivalent circuit on the basis of initial parameters of the applied equivalent circuit.

The equivalent circuit analysis module 114 sequentially changes the parameters of the equivalent circuit such that thus generated initial impedance characteristic data approaches the measured data of the impedance of the slurry Xc. The equivalent circuit analysis module 114 outputs, as an analysis result, the parameters of the equivalent circuit that provide the impedance characteristic data that matches with the measured data. As described above, the equivalent circuit analysis module 114 executes the equivalent circuit analysis by using the equivalent circuit to which the CPE is applied.

In this embodiment, the equivalent circuit analysis module 114 generates, as the impedance characteristic data, the complex plane impedance diagram of the equivalent circuit that is set by the setting unit 121.

The constant phase element (the CPE) means the element including a factor that can take various disturbance into account to the normal capacitor C. The impedance $Z_{CPE}$ of the CPE can be expressed by the following equation (1).

$$Z_{CPE} = \frac{1}{(j\omega)^p T} = \frac{1}{\omega^p T}\cos\left(\frac{\pi}{2}p\right) - j\frac{1}{\omega^p T}\sin\left(\frac{\pi}{2}p\right). \quad (1)$$

wherein, in the above equation (1):
j is an imaginary unit;
ω is an angular frequency;
T is the CPE constant;
p is the CPE index (an order of the $Z_{CPE}$).

As expressed in the above equation (1), the impedance $Z_{CPE}$ of the CPE is composed of the CPE constant T and the CPE index p. For example, when the impedance $Z_{CPE}$ indicates a simple capacitive behavior, the CPE index p takes a value within a range from 0 to 1.

In addition, in the above equation (1), when p=1, the CPE constant T becomes equivalent to the normal capacitor C. In addition, the equivalent circuit for the slurry Xc is formed of the normal capacitor C. Therefore, when p=1, the impedance $Z_{CPE}$ shows the value of the normal capacitor C.

Figure 3A:
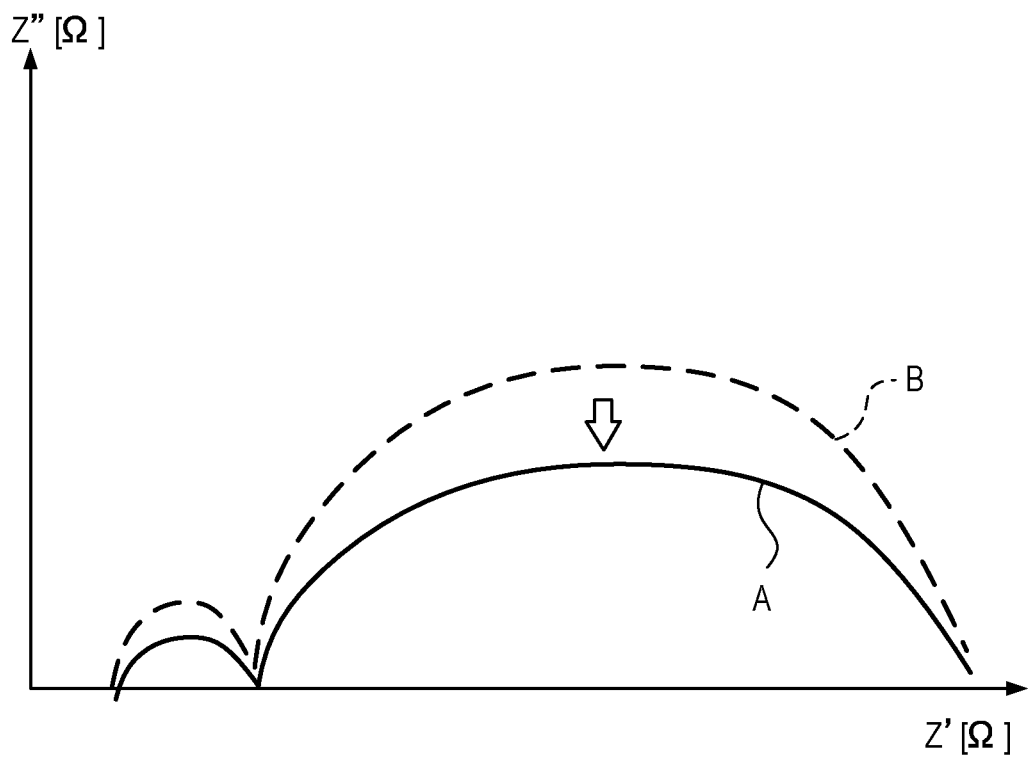
FIG. 3A is a diagram for explaining a complex plane impedance diagram generated by a complex plane impedance data generating module and an equivalent circuit analysis module.

FIG. 3A is a diagram explaining the complex plane impedance diagram generated by the generating module 113 and the equivalent circuit analysis module 114. In addition, FIG. 3B is a diagram showing an equivalent circuit $C_{CPE}$ used for the equivalent circuit analysis.

A solid line shown in FIG. 3A is a complex plane impedance diagram A that is generated by the generating module 113 on the basis of the measured data of the impedance. In addition, a broken line shows a complex plane impedance diagram B that is generated by the equivalent circuit analysis module 114.

Figure 3B:
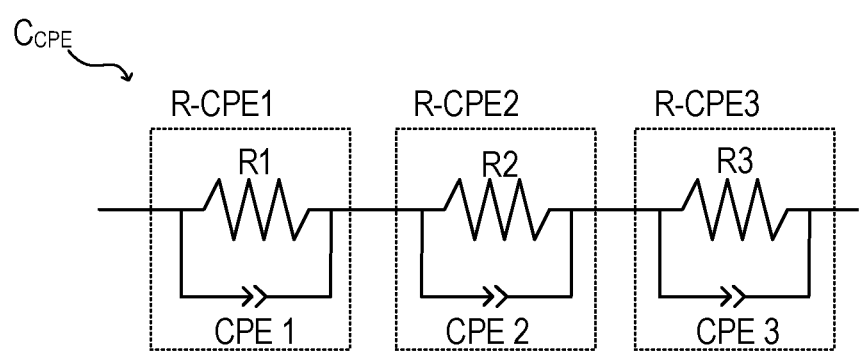
FIG. 3B is a diagram for explaining an equivalent circuit used in an equivalent circuit analysis.

An example of the equivalent circuit $C_{CPE}$ shown in FIG. 3B is the equivalent circuit that is obtained by serially connecting a parallel circuit R-CPE1 formed of a resistor R1 and a CPE1, a parallel circuit R-CPE2 formed of a resistor R2 and a CPE2, and a parallel circuit R-CPE3 formed of a resistor R3 and a CPE3.

The complex plane impedance diagram B shown in FIG. 3A is the complex impedance diagram that is obtained by executing the equivalent circuit analysis by using the equivalent circuit $C_{CPE}$ shown in FIG. 3A.

The equivalent circuit analysis module 114 repeatedly changes the parameters related to the resistors R and the CPE in respective parallel circuits of the equivalent circuit $C_{CPE}$ such that the complex plane impedance diagram B is superimposed on the complex plane impedance diagram A.

The equivalent circuit analysis module 114 acquires and analyses the complex impedance diagram generated by the equivalent circuit analysis module 114.

The equivalent circuit analysis module 114 sets the parameters of the circuit elements of the equivalent circuit such that the complex plane impedance diagram B is superimposed on the complex plane impedance diagram A.

The parameters related to the resistor R and the CPE used when the complex plane impedance diagram B is superimposed on the complex plane impedance diagram A are output to the derivation module 115.

The derivation module 115 derives the index for specifying the state of the slurry Xc on the basis of the parameters input from the parameter calculating unit 122. In this embodiment, the index for specifying the state of the slurry Xc includes the electric characteristic and the physical characteristic. For an example, the electric characteristic is conductivity. In addition, the physical characteristic is homogeneity.

By having the above-described configuration, the processing unit 35 generates the complex plane impedance diagram A from the impedance of the slurry Xc measured by the measurement unit 31. In addition, the processing unit 35 generates, with the equivalent circuit analysis module 114, the complex plane impedance diagram B by using the equivalent circuit having the parallel circuit consisting of the resistor R and the CPE as the unit element, and sets the parameters of the elements of the parallel circuits of the equivalent circuit such that the complex plane impedance diagram B is superimposed on the complex plane impedance diagram A. The processing unit 35 derives the index for specifying the state of the slurry Xc on the basis of the parameters related to a resistance value R of the resistor, an electrostatic capacitance C of the capacitor, and the CPE when the complex plane impedance diagram B is superimposed on the complex plane impedance diagram A.

<Equivalent Circuit Analysis and Index Derivation Calculation>

Figure 4:
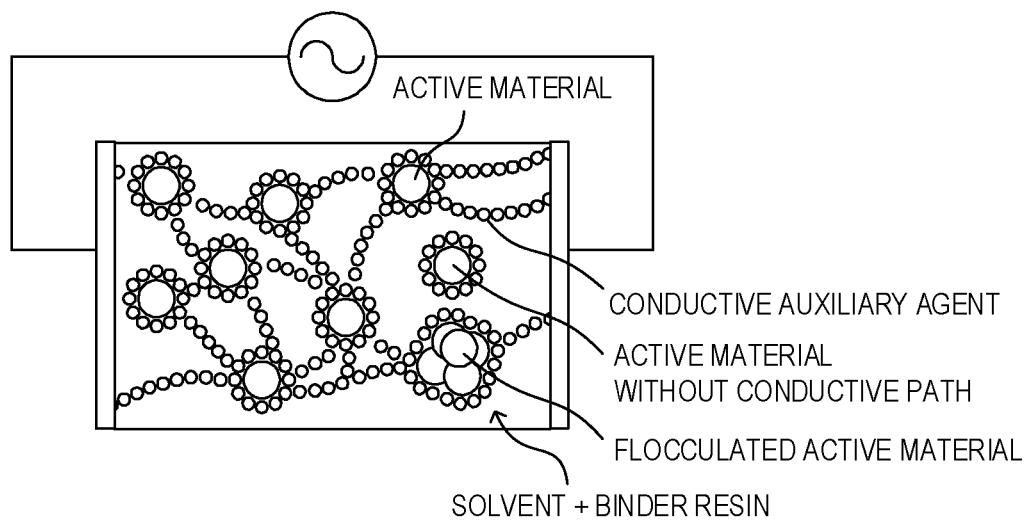
FIG. 4 is a conceptual diagram for explaining the equivalent circuit analysis that is executed by the state determination apparatus according to this embodiment.

Next, in this embodiment, the equivalent circuit analysis executed by the processing unit 35 will be described. FIG. 4 is a conceptual diagram for explaining the equivalent circuit analysis executed by the state determination apparatus 1.

In this embodiment, the slurry Xc is formed by dispersing the conductive auxiliary agent C having a high conductivity into the solvent containing the binder resin B and the active material Xb.

Before explaining the equivalent circuit analysis, a model of the slurry Xc introduced in this embodiment will be explained first.

As shown in FIG. 4, in the slurry Xc, the active material Xb exists as primary particles or are flocculated to form secondary particles. In addition, similarly, the conductive auxiliary agent C also exists as the primary particles or are flocculated to form the secondary particles. It is thought that electrical conductions are formed partially by a dispersed state of the active material Xb and the conductive auxiliary agent C in the solvent containing the binder resin B.

Figure 5:
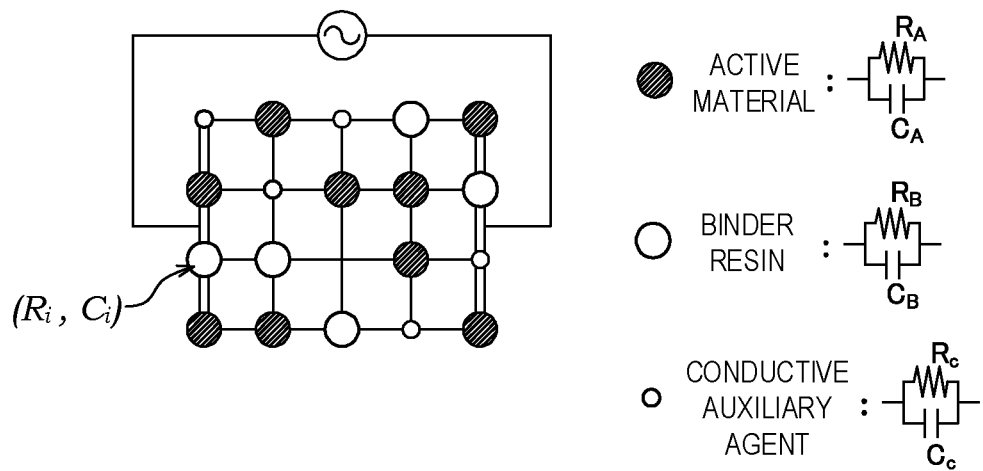
FIG. 5 is a diagram showing a model representing the concept shown in FIG. 4 using a two dimensional grid.

FIG. 5 is a diagram showing a model representing the model of the slurry Xc shown in FIG. 4 by using a two dimensional grid.

Because the active material Xb, the binder resin B, and the conductive auxiliary agent C respectively have a predetermined internal resistance (the impedance), as shown in FIG. 5, it is possible to show each of the active material Xb, the binder resin B, the conductive auxiliary agent C with the parallel circuit using the resistor and the capacitor. Furthermore, it is also possible to represent the entire slurry Xc as a single circuit. In addition, it is also possible to represent each of the active material Xb, the binder resin B, and the conductive auxiliary agent C with the parallel circuit using the resistor, the capacitor, the constant phase element (CPE), and so forth.

Figure 6:
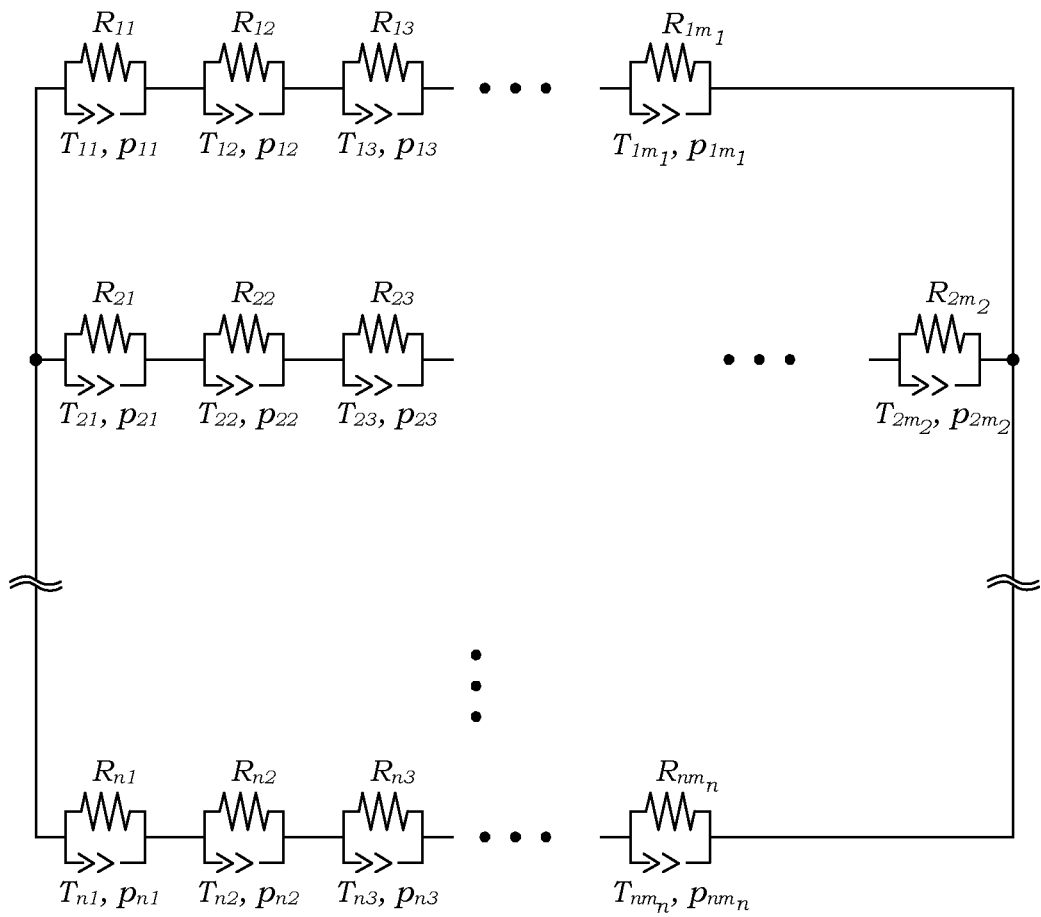
FIG. 6 is a diagram for explaining an example of an equivalent circuit representing the model shown in FIG. 5.

FIG. 6 is a diagram for explaining an example of the equivalent circuit representing the model shown in FIG. 5.

The model shown in FIG. 5 can be represented as the equivalent circuit shown in FIG. 6. In FIG. 6, each of the unit elements respectively consisting of an R11, a T11, and a p11 represents one of a plurality of types of the resistance components formed of the solid matter.

In this embodiment, the slurry Xc contains the active material Xb, the binder resin B, and the conductive auxiliary agent C. Therefore, as the resistance components of the solid matters, the respective internal resistance components of the active material Xb, the binder resin B, and the conductive auxiliary agent C and the contact resistance components between the matters of the same type (between the active materials Xb, between the binder resins B, and between the conductive auxiliary agents C) can be set in the equivalent circuit.

In addition, as the contact resistance component between the solid matters, the contact resistance component between the active material Xb and the binder resin B, the contact resistance component between the active material Xb and the conductive auxiliary agent C, and the contact resistance component between the binder resin B and the conductive auxiliary agent C can be set.

In the model shown in FIG. 5, in practice, the current preferentially flows through a conductive path having the smallest resistance value. Therefore, in the equivalent circuit shown in FIG. 6, among many conductive paths, the effects caused by some elements forming the conductive path with the smallest resistance value become dominant. Thus, it may be possible to omit the conductive paths that are thought to have almost no or little electrical conduction.

The equivalent circuit shown in FIG. 6 can be represented as the series circuit in which the parallel circuits corresponding to the specific resistance components among the above-described resistance components are serially connected.

As an example of such a series circuit, the equivalent circuit $C_{CPE}$ shown in FIG. 3B can be set.

In an example of the equivalent circuit shown in FIG. 3B, a case in which the number of the parallel circuits (the elements) is equal to three is shown. Here, as shown in FIG. 5, the number of the parallel circuits (the elements) can be determined in accordance with the number of types of the resistance components based on the solid matters forming the slurry Xc. Therefore, the total number of the resistance components based on the solid matters contained in the slurry Xc becomes the upper limit of the number of the parallel circuits that can be set in the equivalent circuit.

Here, an upper limit value $N_P^{max}$ of the number of types of the resistance components can be expressed by the following equation.

$$N_P^{max} = {}_{N_M}C_2 + N_M$$

As an example, if the number of types of the solid matter $N_M=2$, according to the above equation, the upper limit value $N_P^{max}$ of the number of types of the resistance components is expressed as $N_P^{max}=5$. In addition, if the number of types of the solid matter $N_M=3$, the upper limit value $N_P^{max}$ of the number of types of the resistance component provided is expressed as $N_P^{max}=9$.

Five types of the components that is the upper limit when the number of types of the solid matter is two will be described using FIG. 4.

The five types of the components include five components: an impedance (Z1) of the active material Xb; an impedance (Z2) of the conductive auxiliary agent C; an impedance (Z11) of an interface between the active material Xb and the active material Xb; an impedance (Z12) of an interface between the active material Xb and the conductive auxiliary agent C; and an impedance (Z22) of an interface between the conductive auxiliary agent C and the conductive auxiliary agent C.

Here, from FIG. 4, because it is thought that only little current flows through the active material Xb, the relation as in the following equation is established between absolute values of the respective impedance.

$$|Z2| \ll |Z11|, |Z12|, |Z11|$$

In addition, if a voltage drop due to |Z22| is negligibly small compared with that due to |Z2|, |Z22| component may not be included as the element. In this case, it is adequate to consider only the element of |Z2|. Therefore, the minimum value of $N_P^{max}$ can be set as unity.

The processing unit 35 generates the complex plane impedance diagram B on the basis of the above-described equivalent circuit, and sets the resistance value R, the CPE constant T, the CPE index p, and so forth that are the parameters of the respective elements of the equivalent circuit such that the complex plane impedance diagram B is superimposed on the complex plane impedance diagram A. Instead of the CPE constant T and the CPE index p, the electrostatic capacitance C may be set.

Then, the derivation module 115 derives the index for specifying the state of the slurry Xc on the basis of the parameters of the respective elements when the complex plane impedance diagram B is superimposed on the complex plane impedance diagram A.

In this embodiment, the derivation module 115 respectively derives, as the above-described indices, the index representing the physical characteristic and the index representing the electric characteristic for the slurry Xc.

An example of the index representing the physical characteristic includes the homogeneity. The derivation module 115 can derive the index representing the homogeneity of the slurry Xc on the basis of at least one value of the resistance value R, the electrostatic capacitance of the capacitor C, and the CPE index p of the parallel circuit among the obtained parameters of the equivalent circuit.

As a specific example, it is possible to derive the index representing the homogeneity of the slurry from the following equations P1 to P3 on the basis of the CPE index p.

$$u_{\lambda\lambda'} = p_{\lambda\lambda'} \quad \text{P1}$$

$$u_\lambda = \Sigma_{\lambda'=1}^{m_\lambda} p_{\lambda\lambda'} \quad \text{P2}$$

$$u = \Sigma_{\lambda=1}^{n} \Sigma_{\lambda'}^{m_\lambda} p_{\lambda\lambda'} \quad \text{P3}$$

In the above-described equations P1 to P3, $\lambda$ is a specific conductive path of current in the slurry Xc, and $\lambda'$ represents the types of the solid matter and the types of the contact between the solid matters. In this embodiment, they are the active material Xb, the binder resin B, and the conductive auxiliary agent C.

$u_{\lambda\lambda'}$ represents the homogeneity of one element of the solid matter.

Therefore, in the above-described model, the CPE index p represents homogeneity u of the solid matter.

$u_\lambda$ a represents the summed total of the homogeneity for a certain solid matter and the contact between the solid matters in a certain conductive path.

u represents the summed total of the homogeneity obtained by adding the summed total of the homogeneity for the homogeneity of the solid matter and the homogeneity for the contact between the solid matters in a certain conductive path, which is obtained for each of the plurality of contained solid matters.

In addition, an example of the index representing the electric characteristic includes the conductivity. The derivation module 115 can derive the conductivity of the slurry Xc on the basis of at least one value of the resistance value R, the electrostatic capacitance of the capacitor C, the CPE constant T, and the CPE index p of the parallel circuit among the obtained parameters of the equivalent circuit.

In other words, it is possible to derive the index that depends on the DC resistance of the slurry Xc from the total of the resistance values R. In addition, it is possible to derive the index that depends on the capacity at the high-frequency limit of the slurry Xc from the total of the capacitor C or the CPE constant T. In addition, it is possible to derive a ratio of the resistance of the solid matter of interest relative to the resistance of the whole slurry Xc. In addition, it is possible to derive a ratio of the capacity of the solid matter of interest relative to the capacity of the whole slurry Xc.

More specifically, it is possible to derive the index representing the electric characteristic from the following equations E1 to E10.

$$\alpha_{\lambda\lambda'} = R_{\lambda\lambda'} \quad \text{E1}$$

$$\alpha_{\lambda\lambda'} = T_{\lambda\lambda'} \quad \text{E2}$$

$$\alpha = \Sigma_{\lambda=1}^{n} \Sigma_{\lambda'=1}^{m_\lambda} \epsilon_{\lambda\lambda'} R_{\lambda\lambda'} \quad \text{E3}$$

$$\alpha_\lambda = \Sigma_{\lambda'=1}^{m_\lambda} \epsilon_{\lambda\lambda'} R_{\lambda\lambda'} \quad \text{E4}$$

$$\alpha^{-1} = \Sigma_{\lambda=1}^{n} \Sigma_{\lambda'=1}^{m_\lambda} \epsilon_{\lambda\lambda'} (R_{\lambda\lambda'}^{p-1} T_{\lambda\lambda'}^{p})^{-1} \quad \text{E5}$$

$$\alpha_\lambda^{-1} = \Sigma_{\lambda'=1}^{m_\lambda} \epsilon_{\lambda\lambda'} (R_{\lambda\lambda'}^{p-1} T_{\lambda\lambda'}^{p})^{-1} \quad \text{E6}$$

wherein $\epsilon_{\lambda\lambda'} = 0$ or 1

$$\alpha_{\lambda\lambda'} = \frac{R_{\lambda\lambda'}}{R_{\lambda\lambda'}^0} \quad \text{E7}$$

$$\alpha_{\lambda\lambda'\eta\eta'} = \frac{R_{\lambda\lambda'}}{R_{\lambda\lambda'}^0} \bigg/ \frac{R_{\eta\eta'}}{R_{\eta\eta'}^0} \quad \text{E8}$$

$R_{\lambda\lambda'}^0$ is value in reference slurry $$\alpha_{\lambda\lambda'} = \frac{R_{\lambda\lambda'}}{\sum_{\lambda=1}^{n} \sum_{\lambda'=1}^{m_\lambda} R_{\lambda\lambda'}} \quad \text{E9}$$

$$\alpha = \left( \prod_{\lambda=1}^{n} \prod_{\lambda'=1}^{m_\lambda} R_{\lambda\lambda'} \right)^{nm_\lambda} \quad \text{E10}$$

In the above-described equations E1 to E10, the $\lambda$ is the conductive path of the certain current in the slurry Xc, and the $\lambda'$ is the types of the solid matter and the types of the contact between the solid matters. In this embodiment, they are the active material Xb, the binder resin B, and the conductive auxiliary agent C.

$\alpha_{\lambda\lambda'}$ represents the conductivity for the resistance for the solid matter or contact $\lambda'$ of interest in the conductive path $\lambda$ of interest among the plurality of conductive paths of the current.

a represents the summed total of the resistance of the slurry Xc.

$\alpha^{-1}$ represents the summed total the capacity of the slurry Xc.

$\alpha_\lambda$ represents the sum of the resistance in the path $\lambda$ of interest.

$\alpha_\lambda^{-1}$ represents the sum of the capacity in the path $\lambda$.

In addition, the derivation module 115 calculates relaxation time $\tau_x^{calc}$ of the respective elements from the parameters of the respective elements obtained by the equivalent circuit analysis.

The present inventors have found that the intrinsic relaxation time is present for each of the solid matters themselves, the contact between the solid matters of the same type, or the contact between the solid matters of the different types, that are set on the basis of the above-described model.

When the equivalent circuit shown in FIG. 6 is applied as the equivalent circuit representing the model shown in FIG. 5, it is possible to calculate the relaxation time of the respective elements in accordance with the following equation by using the resistance value R of the resistor, the CPE constant T, and the CPE index p of the respective elements obtained by the equivalent circuit analysis.

$$\tau_{\lambda\lambda'}^{calc} = (T_{\lambda\lambda'} R_{\lambda\lambda'})^{1/p\lambda\lambda'}$$

As an example, it is possible to specify the impedance value of the respective elements and the types of the solid matters (the type of the interface between the solid matters) by comparing the relaxation time $\tau_x^{calc}$ of the respective elements calculated by the equivalent circuit analysis of the impedance of the slurry Xc that has been measured and standard relaxation time $\tau_\lambda^{ref}$ of the respective elements obtained by measuring the reference slurry whose slurry state is known.

As described above, the state determination apparatus 1 according to this embodiment can derive, as described above, the physical characteristic and the electric characteristic from the parameters related to the respective elements obtained by executing the equivalent circuit analysis.

<State Determining Processing>

Next, the state determining processing for deriving and measuring the physical characteristic and the electric characteristic as the evaluation indices of the slurry Xc will be described with reference to FIG. 7.

Figure 7:
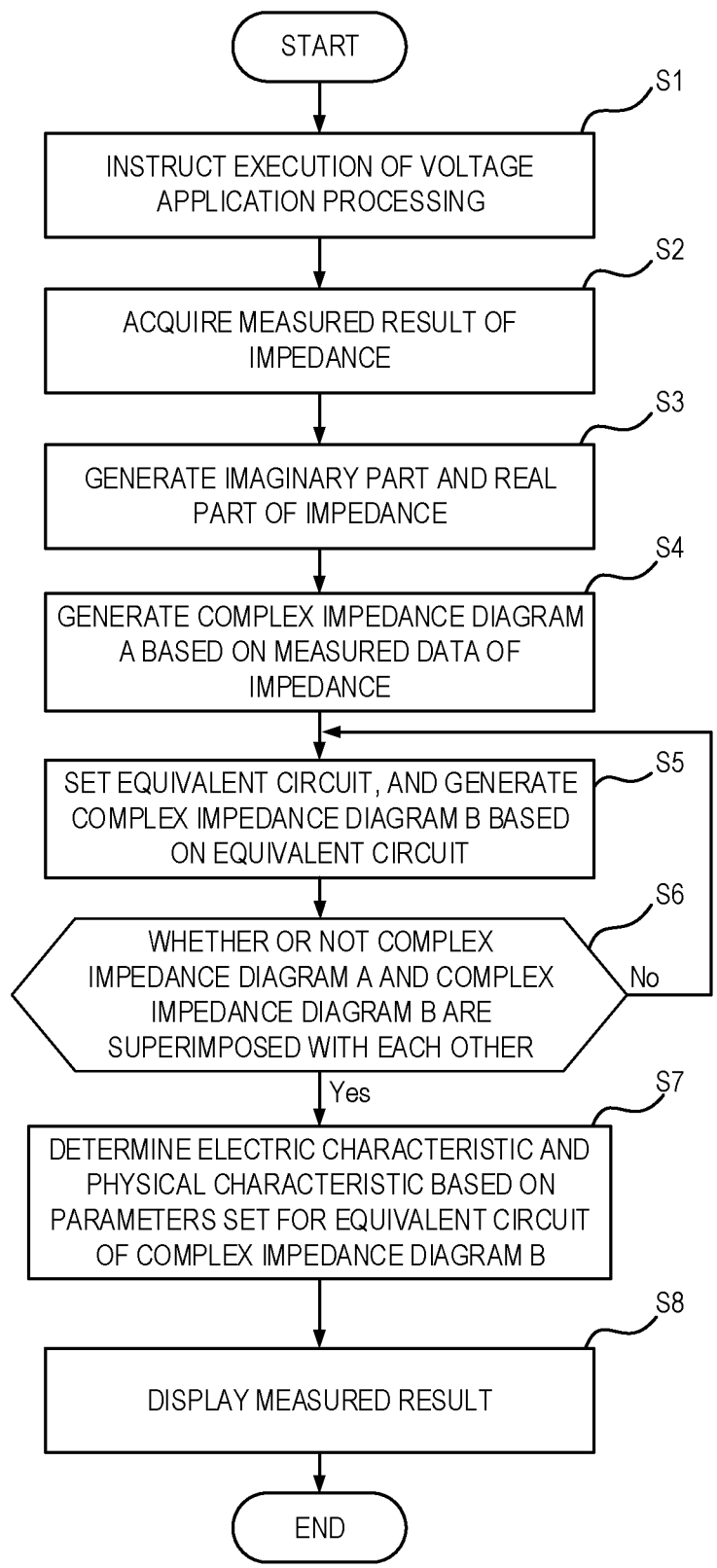
FIG. 7 is a flowchart showing a state determining processing executed by the state determination apparatus.

FIG. 7 is a flowchart showing the state determining processing executed by the state determination apparatus 1.

First, as a measurer operates the operating unit 33 and the state determining processing is started, the processing proceeds to step S1.

In step S1, the analysis setting module 111 of the processing unit 35 instructs the measurement unit 31 to execute voltage application processing to the slurry Xc. Specifically, the analysis setting module 111 instructs the measurement unit 31 to execute the processing in which the AC voltage is applied to the slurry Xc while changing the frequency.

By doing so, in accordance with the instruction from the analysis setting module 111, the measurement unit 31 executes the control in which the AC voltage is applied to the slurry Xc via the pair of electrodes 2 and the frequency of the AC voltage applied is changed.

In addition, every time the frequency of the AC voltage is changed, the measurement unit 31 measures the impedance of the slurry Xc from the response current flowing through the slurry Xc by the pair of electrodes 2. The measurement unit 31 then outputs the measured impedance as the measured data to the impedance acquisition module 112 of the measurement apparatus main body 3.

Next, in Step S2, the impedance acquisition module 112 acquires the measured data of the impedance from the measurement unit 31.

In step S3, the impedance acquisition module 112 generates the imaginary components and the real components of the impedance. The impedance acquisition module 112 outputs thus generated imaginary components and real components to the generating module 113.

Next, in Step S4, the generating module 113 generates the complex plane impedance diagram A on the basis of the measured data of the impedance, as shown in FIG. 3A, and outputs the generated complex plane impedance diagram A to the equivalent circuit analysis module 114.

In step S5, on the basis of the measured data, the equivalent circuit analysis module 114 sets, on the basis of the resistance components of the solid matters contained in the slurry Xc, the parallel circuit (R-CPE circuit) formed of the resistor R and the CPE and the number of the R-CPE circuit forming the equivalent circuit, and thereafter, executes the equivalent circuit analysis to calculates the parameters of the equivalent circuit.

The equivalent circuit analysis module 114 then generates the complex plane impedance diagram B of the set equivalent circuit.

For example, when the initial value is required, the equivalent circuit analysis module 114 sets the diameter of a semi-circle drawn on the complex plane as R on the basis of the measured data of the slurry Xc, sets the frequency at the apex of the semi-circle as $f_{top}$, sets the initial CPE constant T as expressed in the next equation (2), and sets the initial CPE index p as unity. The equivalent circuit analysis module 114 then generates the complex plane impedance diagram B of the initial equivalent circuit on the basis of the set values of the CPE constant T and the CPE index p.

$$T = \frac{1}{R \cdot f_{top}} \quad (2)$$

In Step S6, the equivalent circuit analysis module 114 determines whether or not the complex plane impedance diagram A and the complex plane impedance diagram B are superimposed with each other by comparing both diagrams.

When the complex plane impedance diagram A and the complex plane impedance diagram B are not superimposed with each other (Step S6: No), the processing returns to Step S5, and the equivalent circuit analysis module 114 resets the parameters (variables) of the circuit elements of the equivalent circuit $C_{CPE}$ and generates a new complex plane impedance diagram B.

The equivalent circuit analysis module 114 repeats the setting of the parameters related to the resistor R and the CPE in each parallel circuit of the equivalent circuit $C_{CPE}$ such that the complex plane impedance diagram B is superimposed on the complex plane impedance diagram A that has been acquired from the generating module 113. This processing is referred to as fitting processing.

When the complex plane impedance diagram A and the complex plane impedance diagram B are superimposed with each other (Step S6: Yes) in the equivalent circuit analysis module 114, the equivalent circuit analysis module 114 outputs the final complex plane impedance diagram B obtained to the derivation module 115.

In step S7, the derivation module 115 acquires the equivalent circuit parameters (the resistance value R, the electrostatic capacitance C, the CPE constant T, and the CPE index p) related to the complex plane impedance diagram B from the equivalent circuit analysis module 114.

The derivation module 115 derives the index representing the physical characteristic of the slurry Xc and the index representing the electric characteristic on the basis of the parameters of the respective elements.

Next, in step S8, the display unit 34 displays the electric characteristic and the physical characteristic of the slurry Xc in accordance with the instruction from the processing unit 35. The processing unit 35 then terminates the state determining processing.

<State Determining Program>

The above-described state determination method may also be provided as a program for causing a computer to execute determination of state.

In other words, the program according to this embodiment is a program for causing the computer to execute the determination of the state of the slurry Xc as the mixture in which the insoluble solid matter (the active material Xb) is mixed in the liquid Xa, and it is the program for causing the computer to execute the processing including: a step of applying the AC signal to the slurry Xc while changing the frequency of the AC signal; a step of measuring the impedance of the slurry Xc for every frequency of the AC signal on the basis of the response signal flowing through the slurry Xc when the AC signal is applied to the slurry Xc; a step of obtaining, from the measured impedance, the equivalent circuit that includes the parallel circuit formed of the resistor R and the capacitor C or the constant phase element (CPE) as the element corresponding to the internal resistance component of the active material Xb; a step of calculating the parameters of the parallel circuits by executing the equivalent circuit analysis such that the impedance of the equivalent circuit approximates the impedance of the slurry Xc; and a step of deriving the index for specifying the state of the slurry Xc on the basis of the parameters of the parallel circuits.

In this embodiment, the above-described program may be stored in the storage unit 32, and it may be provided by being recorded in a storage medium that is attachable/detachable to/from the state determination apparatus 1.

<Operational Advantages>

Next, operational advantages achieved by this embodiment will be described.

The state determination apparatus 1 according to this embodiment measures the impedance of the slurry Xc serving as the mixture from the response current flowing through the slurry Xc and sets the equivalent circuit including, as at least one unit element, the parallel circuit (R-C/R-CPE) corresponding to the resistance components of the solid matters (the active material Xb, the binder resin B, and the conductive auxiliary agent C) contained in the slurry Xc. The state determination apparatus 1 then generates the complex plane impedance diagram B of the set equivalent circuit, calculates the parameter related to the equivalent circuit by performing the fitting processing, and deriving the index for specifying the state of the slurry Xc from the parameters of the obtained parallel circuit.

The present inventors have first found that it is possible to grasp the state of the mixture from the parameters of the parallel circuits (R-C/R-CPE) by considering the parallel circuits (R-C/R-CPE) as the resistance components of the solid matters contained in the mixture. Therefore, upon derivation of the above-described index, the state determination apparatus 1 treats the parameters of the obtained parallel circuits as the resistance components of the solid matters contained in the mixture. By doing so, the index that is derived on the basis of the parameters of the obtained parallel circuits is changed in accordance with the change in the state of the solid matters in the mixture, and thus, it becomes possible to specify the state of the mixture from the index.

Therefore, the state determination apparatus 1 can easily derive the index for specifying the state of the mixture by executing the equivalent circuit analysis by using the measured data of the impedance of the slurry Xc obtained by applying the current to the slurry Xc.

In the state determination apparatus 1, the setting unit 121 sets the equivalent circuit including the series circuits formed by serially connecting the parallel circuit corresponding to the internal resistance component of the solid matter and the parallel circuit corresponding to the contact resistance component between the solid matters. By doing so, the state determination apparatus 1 can improve the accuracy of the equivalent circuit analysis by taking the contact resistance component into consideration in addition to the internal resistance component of the solid matter.

In the state determination apparatus 1, when the plurality of types of solid matters are mixed in the slurry Xc, the setting unit 121 sets the parallel circuits corresponding to the respective internal resistance components of the plurality of types of the solid matters, the parallel circuits corresponding to the respective contact resistance components between the solid matters of the same types, and the parallel circuits corresponding to the respective contact resistance components between the solid matters of different types. By doing so, the state determination apparatus 1 can easily derive the index for specifying the state of the mixture even with the liquid in which the plurality of types of solid matters are mixed.

In addition, the setting unit 121 can set the number of the above-described parallel circuits (the element) so as to be equal to or less than the total number of the resistance components of all of the solid matters. Therefore, it is possible to set the number of the element of the equivalent circuit analysis suitably, and so, it is possible to reduce the amount of computation.

As shown in the above-described equations P1 to P3 and the equations E1 to E10, the derivation module 115 derives the index for specifying the state of the mixture on the basis of the value given by mutually composing at least one parameter among the resistance value R of the resistor, the electrostatic capacitance of the capacitor C, the CPE constant T, and the CPE index p in the parallel circuits corresponding to the internal resistance component or the contact resistance component of the plurality of types of solid matters. Therefore, according to the state determination apparatus 1, it is possible to easily acquire the state of the mixture.

According to the state determination apparatus 1, it is possible to derive the homogeneity of the slurry Xc on the basis of the resistance value R, the electrostatic capacitance C, and the CPE index p that are the parameters of the respective elements of the equivalent circuit. In addition, the conductivity of the slurry Xc can be derived on the basis of the resistance value R, the electrostatic capacitance C, the CPE constant T, the CPE index p, and so forth that are the parameters of the respective elements of the equivalent circuit. Therefore, it is possible to objectively acquire the date that may specify the state of the mixture.

As shown in this embodiment, the state determination apparatus 1 can be suitably used for the slurry, in which the active material, the binder, and the conductive auxiliary agent are dispersed in the solvent as the solid matters, that is used for the positive electrode of the lithium ion battery.

[Other Embodiments of Equivalent Circuit Analysis and Index Derivation Calculation]
<First Modification>

Figure 8:
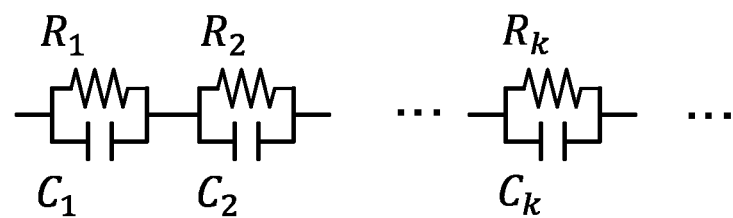
FIG. 8 is a diagram for explaining a first modification of the equivalent circuit representing the model shown in FIG. 5.

FIG. 8 is a diagram for explaining a first modification of the equivalent circuit representing the model shown in FIG. 5.

As shown in FIG. 8, the equivalent circuit shown in FIG. 6 may be substituted with the equivalent circuit having the parallel circuits formed of the resistor R and the capacitor C as the unit elements.

Also in a case of the first modification, similarly to the above-described equivalent circuit analysis, the number of the parallel circuits (the elements) can be set in accordance with the number of the resistance components based on the solid matters contained in the slurry Xc.

In addition, in the first modification, the complex plane impedance of the slurry Xc can be defined by the following equation (3).

$$Z(\omega) = \int_0^\infty \frac{R(\tau)}{1+\tau\omega} d\tau \tag{3}$$

In the equivalent circuit analysis in the first modification, the equivalent circuit analysis module 114 calculates Rk and Ck by performing the fitting processing of the complex plane impedance diagram A and the complex plane impedance diagram B. In addition, the derivation module 115 derives, from the product of Rk and Ck, relaxation time $\tau_k$ in accordance with the following equation.

$$\tau_k^{calc} = R_k C_k$$

The derivation module 115 plots the correspondence relationship by taking the relaxation time τ on the horizontal axis and taking the resistance value R on the vertical-axis.

Figure 9:
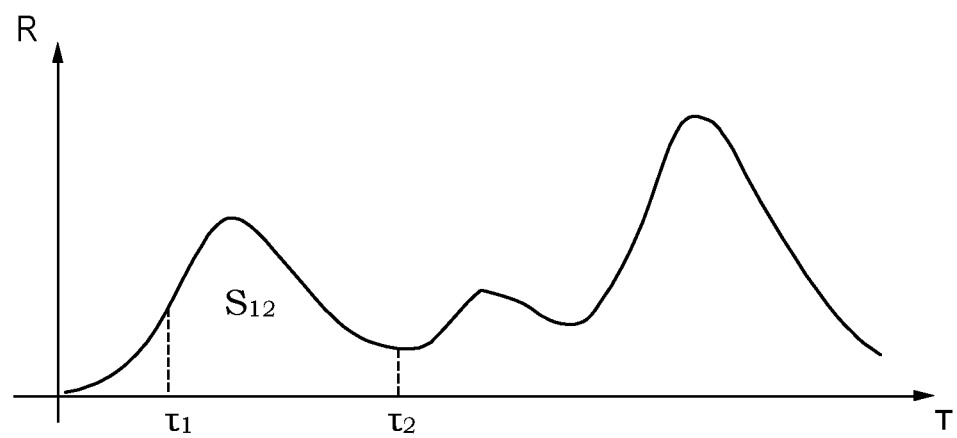
FIG. 9 is a diagram generated by a derivation module and showing the correspondence relationship between relaxation time τ and resistance value R.

FIG. 9 is a diagram generated by the derivation module 115 showing the correspondence relationship between the relaxation time L and the resistance value R. The derivation module 115 sets, on the τ-R plot shown in FIG. 9, a region $S_{12}$ that is sectioned by an arbitrary section $\tau_1$ to $\tau_2$.

According to the first modification, as shown by the following equation (4), by calculating a variance of the relaxation time τ in the region $S_{12}$, it is possible to derive the homogeneity u of the slurry Xc. In addition, as shown in the following equation (5), the homogeneity u can also be derived from the half-widths of R in the region $S_{12}$.

In addition, with the following equation (6) or equation (7), it is possible to derive conductivity α of the slurry Xc.

$$u = [\text{variance of } \tau \text{ in } S_{12}] = \frac{1}{N_{12}} \sum_{k \in S_{12}} R_k (\tau_k - \overline{\tau})^2 \tag{4}$$

$\overline{\tau}$ : average value, $N_{12}$ : number of points $$u = [R \text{ half width in } S_{12}] \tag{5}$$

$$\alpha = \int_{S_{12}} R(\tau) d\tau \tag{6}$$

$$\alpha = \text{average value of } R \text{ in } S_{12} \tag{7}$$

In addition, by comparing the relaxation time $\tau_k$ of the respective elements calculated by the equivalent circuit analysis of the measured impedance of the slurry Xc with the standard relaxation time $\tau_\lambda^{ref}$ of the respective elements obtained by the measurement of the reference slurry whose slurry state is known, it is possible to specify the impedance values and the types of the solid matters (the type of the interface between the solid matters) of the respective elements.

<Second Modification>

Figure 10:
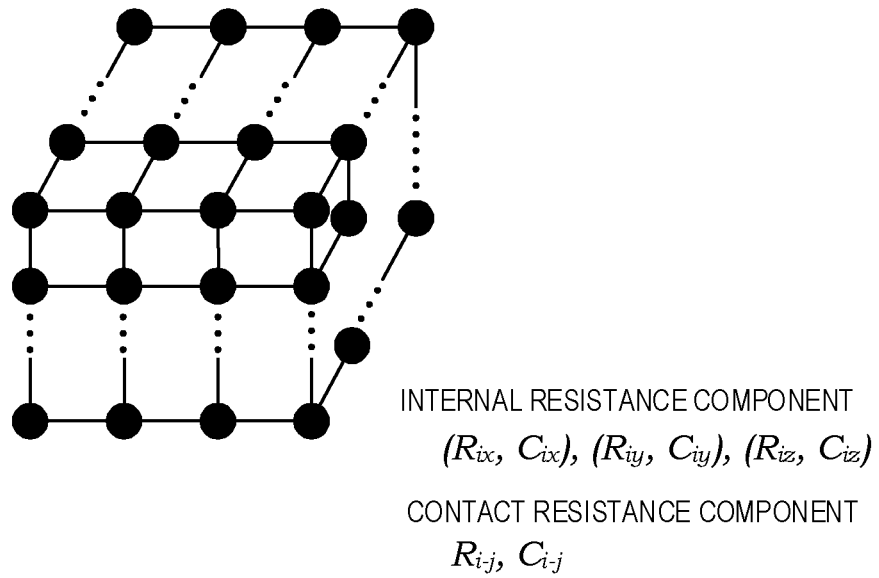
FIG. 10 is a diagram for explaining a second modification of the equivalent circuit representing the model shown in FIG. 5.

FIG. 10 is a diagram for explaining a second modification of the equivalent circuit representing the model shown in FIG. 5.

In the second modification, the internal resistance components of the solid matters can be expressed by ($R_{ix}$, $C_{ix}$), ($R_{iy}$, $C_{iy}$), ($R_{iz}$, $C_{iz}$) by using the discrete representation, and the contact resistance component between the solid matters can be expressed by $R_{i\text{-}j}$, $C_{i\text{-}j}$. The respective resistance components may also be expressed by using the continuous representation instead of the discrete representation.

In the equivalent circuit analysis in the second modification, the equivalent circuit analysis module 114 calculates the respective parameters of the equivalent circuits by performing the fitting processing of the complex plane impedance diagram A and the complex plane impedance diagram B by using the equivalent circuit based on a three dimensional lattice model shown in FIG. 10.

The derivation module 115 plots the correspondence relationship by taking the resistance value R on the horizontal axis and taking appearance frequency of R on the vertical-axis.

Figure 11:
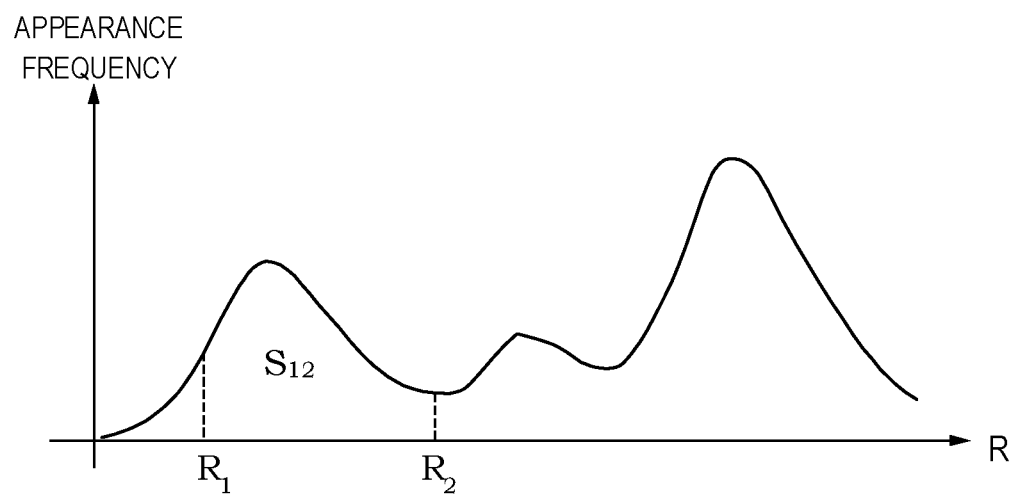
FIG. 11 is a diagram generated by the derivation module and showing the correspondence relationship between the resistance value R and appearance frequency.

FIG. 11 is a diagram generated by the derivation module 115 and showing the correspondence relationship between the resistance value R and the appearance frequency. The derivation module 115 sets, on the plot shown in FIG. 11, the region $S_{12}$ that is sectioned by an arbitrary section $R_1$ to $R_2$.

According to the second modification, as shown by the following equation (8), by calculating a variance of the resistance value R in the region $S_{12}$, it is possible to derive the homogeneity u of the slurry Xc. In addition, as shown the following equation (9), the homogeneity u can also be derived from the half-widths of the appearance frequency in the region $S_{12}$.

Furthermore, the conductivity α of the slurry Xc can be derived from the following equation (10) or equation (11).

$$u = [\text{variance of } R \text{ in } S_{12}] = \frac{1}{N_{12}} \sum_{k \in S_{12}} [\text{appearance frequency}] \times (R_k - \overline{R})^2 \quad (8)$$

$\overline{R}$: average value, $N_{12}$: number of points $$u = [\text{appearance frequency half width in } S_{12}] \quad (9)$$

$$\alpha = \int_{S_{12}} [\text{appearance frequency}] dR \quad (10)$$

$$\alpha = \text{average value of } R \text{ in } S_{12} \quad (11)$$

In addition, with the equivalent circuit based on the three dimensional lattice model shown in FIG. 10, the relaxation time can be expressed by the following equation.

$$\tau_{ix(iy,iz)}^{calc} = R_{ix(iy,iz)} C_{ix(iy,iz)}$$

By comparing relaxation time $\tau_{ix(iy,iz)}^{calc}$ of the respective elements calculated by the equivalent circuit analysis of the measured impedance of the slurry Xc with the standard relaxation time $\tau_\lambda^{ref}$ of the respective elements obtained by the measurement of the reference slurry whose slurry state is known, it is possible to specify the impedance values and the types of the solid matters (the type of the interface between the solid matters) of the respective elements.

<Third Modification>

As a third modification, similarly to the first modification, the derivation module 115 may plot the correspondence relationship by taking the relaxation time Z on the horizontal axis and taking the resistance value R on the vertical-axis by using the relaxation time Z and the resistance value R among the respective parameters of the equivalent circuit calculated by using the three dimensional lattice model of the second modification.

On the τ-R plot obtained similarly to those shown in FIG. 9, the derivation module 115 can set the region $S_{12}$ that is sectioned by the arbitrary section $\tau_1$ to $\tau_2$ and can derive the homogeneity u of the slurry Xc by applying the equations (4) to (7).

<Fourth Modification>

As a fourth modification, the derivation module 115 performs the following processing by using the respective parameters of the equivalent circuit calculated by using the three dimensional lattice model of the second modification.

The model used in the fourth modification has less approximation, and thus, it is possible to set a model closer to the actual state of the slurry Xc.

In the equivalent circuit analysis of the fourth modification, the equivalent circuit analysis module 114 performs the fitting processing of the complex plane impedance diagram A and the complex plane impedance diagram B by using the equivalent circuit based on the three dimensional lattice model and calculates the resistance value $R_i$ corresponding to the respective elements so as to be associated with the positional coordinate of the respective elements forming the three dimensional lattice.

In the three dimensional lattice, an arbitrary range $R_i$ to $R_2$ is set for the resistance value $R_i$. In a region $\Omega_{12}$ set by this range, the positional coordinate ($i_x$, $i_y$, $i_z$)=i at which the resistance value $R_i$ has the value falling within the range $R_1$ to $R_2$, which is obtained by the fitting processing, is extracted as the lattice of the appearance frequency 1 of the resistance value $R_i$.

Figure 12A:
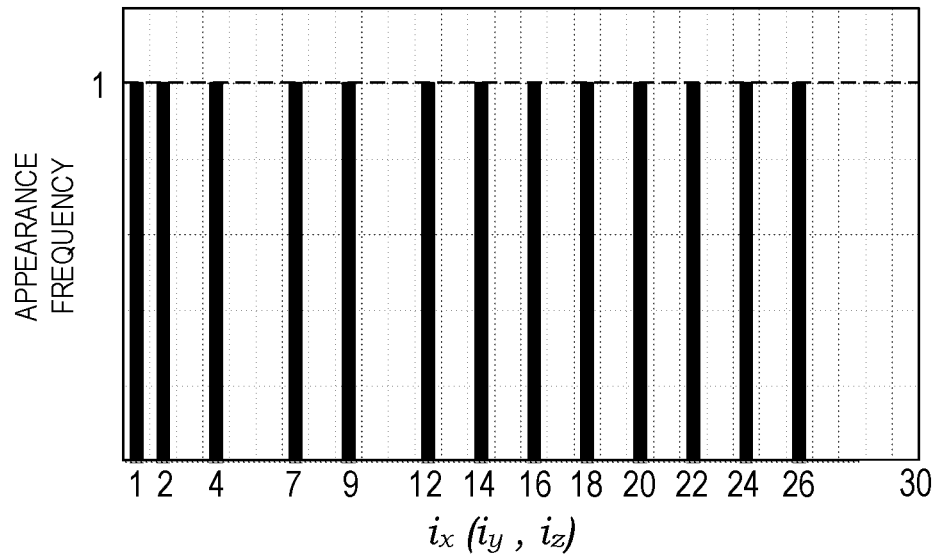
FIG. 12A is a diagram generated by the derivation module and showing the correspondence relationship between a positional coordinate i and the appearance frequency of R.
Figure 12B:
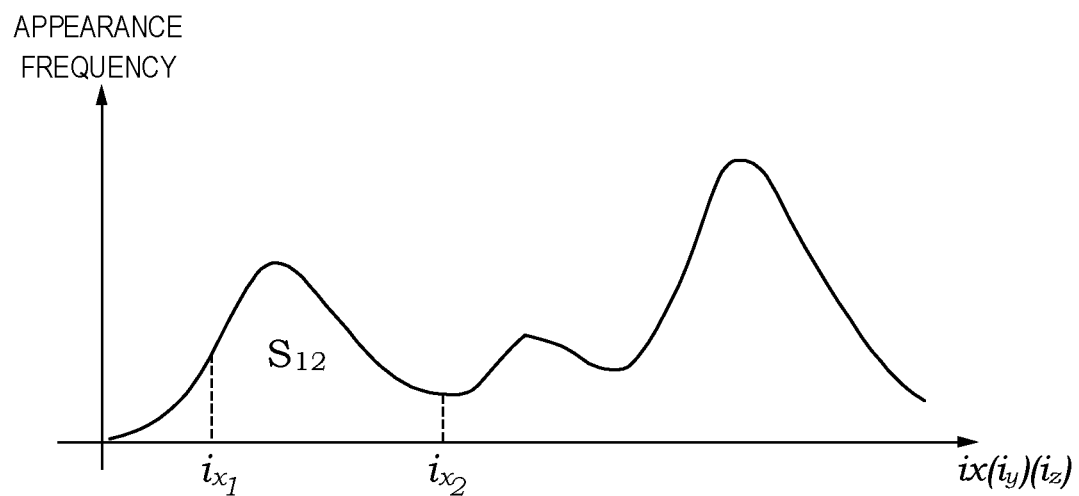
FIG. 12B is a diagram generated by the derivation module and showing the correspondence relationship between the positional coordinate i and the appearance frequency of R in the continuous representation.

FIG. 12A is a diagram generated by the derivation module 115 and showing the correspondence relationship between the positional coordinate i and the appearance frequency of R, provided that FIG. 12A shows a case in which the discrete representation is employed. FIG. 12B is a diagram generated by the derivation module 115 and showing the correspondence relationship between the positional coordinate i and the appearance frequency of R in the continuous representation.

As shown in FIG. 12B, the derivation module 115 plots the correspondence relationship by taking $i_x$ on the horizontal axis and taking the appearance frequency of R on the vertical-axis. $i_y$, $i_z$ may also be taken on the horizontal axis. On this i-R plot, the region $S_{12}$ is set by being sectioned by an arbitrary section $i_1$ to $i_2$.

With equations (12) to (15), the derivation module 115 can derive the homogeneity u of the slurry Xc and the conductivity α.

$$u = [\text{variance of } |\vec{i}| \text{ in } S_{12}] = \frac{1}{N_{12}} \sum_{k \in S_{12}} [\text{apppearance frequency}] \times (|\vec{i}| - \overline{|\vec{i}|})^2 \quad (12)$$

$\overline{|\vec{i}|}$: average value, $N_{12}$: number of points $$u = [\text{appearance frequency half width in } S_{12}] \quad (13)$$

-continued $$\alpha = \int_{S_{12}} R(\tau) d\tau \quad (14)$$

$\alpha$ = average value of $R$ in $S_{12}$ (15)

In FIG. 12A, as an example, a range of the positional coordinate is set so as to fall within a range from 1 to 30. In this case, the homogeneity u can be calculated by the following equation.

$$u = [\text{variance of } |\vec{i}| \text{ in } S_{12}] =$$

$$\frac{1}{N_{13}} \sum_{i=1}^{30} [\text{appearance frequency}] \times \left( |\vec{i}| - \overline{|\vec{i}|} \right)^2$$

Other Embodiments

Although the embodiments of the present invention have been described in the above, the above-mentioned embodiments merely illustrate a part of application examples of the present invention, and the technical scope of the present invention is not intended to be limited to the specific configurations of the above-described embodiments.

Although the state determination apparatus 1 is provided with the pair of electrodes 2, three or more electrodes may be provided. It is also possible to measure the impedance of the slurry Xc by using three or more electrodes.

In the state determination apparatus 1, the storage unit 32, the operating unit 33, and the display unit 34 may also be configured separately from the determination apparatus main body 3. In addition, the measurement unit 31 may also be provided as a separate apparatus, such as an analyzer, for example, by being separated from the state determination apparatus 1.

The state determination apparatus 1 may take various forms. For example, the state determination apparatus 1 may also be configured as that of a stationary type. In addition, the state determination apparatus 1 may also be configured as a portable device.

Example

The physical characteristic and the electric characteristic of the mixture were derived by using the state determination apparatus 1 according to this embodiment to perform the evaluation of the mixture. As the mixture, the slurry used for the positive electrode of the lithium ion battery was used.

<Composition of Specimen>

The composition of specimen is as follows.
(Solid Matter)
Active Material: $LiCO_2$ 42.3 mass %
Conductive Auxiliary Agent: furnace black 2.4 mass %
Binder Resin: poly vinylidene difluoride (PVdF) 2.4 mass %
(Solvent)
N-methyl pyrrolidone (NMP) 52.9 mass %

In other words, the slurry is formed by dispersing $LiCO_2$, the furnace black, and the PVdF in N-methyl pyrrolidone (NMP) as the solvent.

<Preparation of Specimen>

A plurality of specimens were prepared for the above-described slurry with different stirring time. Specifically, the specimens were prepared with the stirring time of 1 minute, 6 minutes, 12 minute, 18 minutes, 24 minutes, and 30 minutes. The stirring of the slurry were performed by using Awatori Neritaro (the trade name) from THINKY CORPORATION.

<Determination of the State of the Specimen>

By using the state determination apparatus 1, the states of the respective specimens prepared with different stirring times were measured. In this example, the index related to the homogeneity among the physical characteristics and the index related to the conductivity among the electric characteristics were respectively derived as the indices for specifying the state of the slurry.

Figure 13:
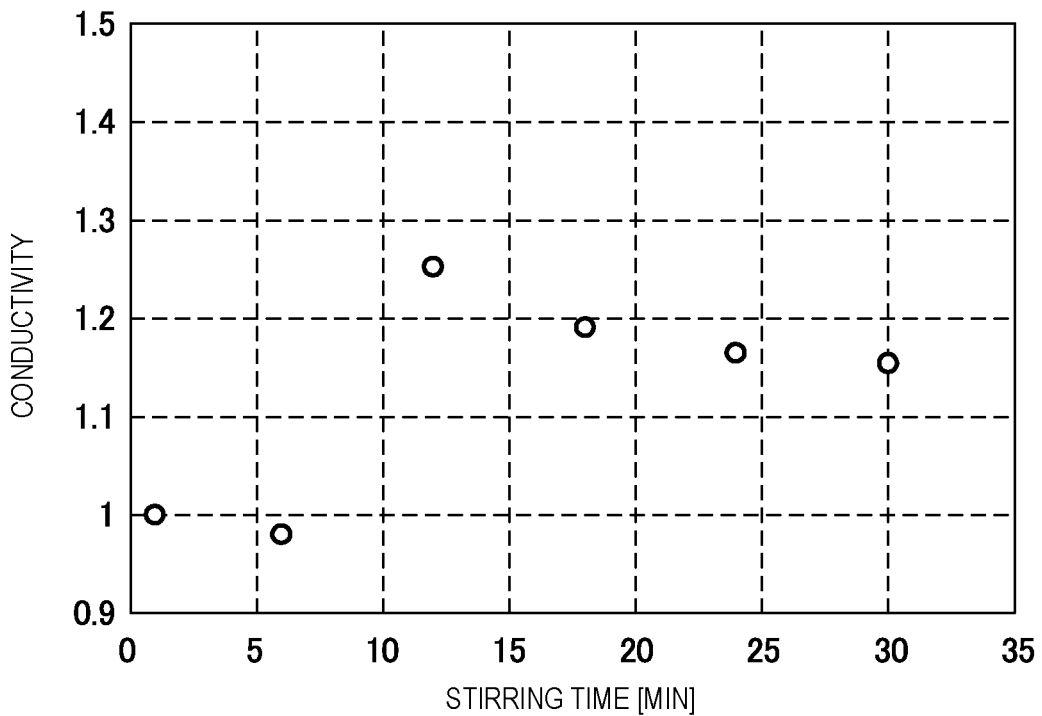
FIG. 13 is a diagram in which an index of conductivity is plotted against stirring time.
Figure 14:
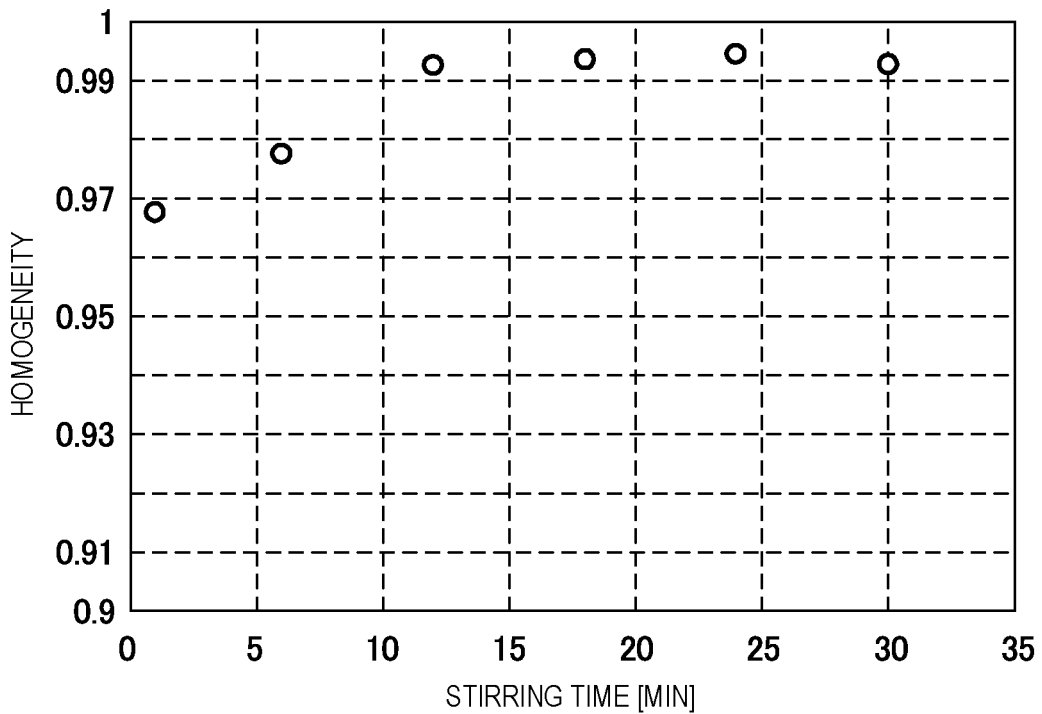
FIG. 14 is a diagram in which an index of homogeneity is plotted against the stirring time.

The results are shown in FIGS. 13 and 14.

<Results>

FIG. 13 is a diagram in which the index of the conductivity is plotted against the stirring time, and FIG. 14 is a diagram in which the index of the homogeneity is plotted against the stirring time.

According to FIG. 13, it was found that the conductivity of the slurry has a tendency in that the conductivity becomes excellent by setting the stirring time longer, but if the stirring time exceeds 12 minutes, the conductivity is decreased and converges to a specific value.

In addition, according to FIG. 14, it was found that the homogeneity of the slurry has a tendency in that the homogeneity becomes excellent by setting the stirring time longer, and the homogeneity reaches the peak between the stirring time from 12 minutes to 24 minutes while it is stabilized at about the peak value with much longer stirring time.

Figure 15:
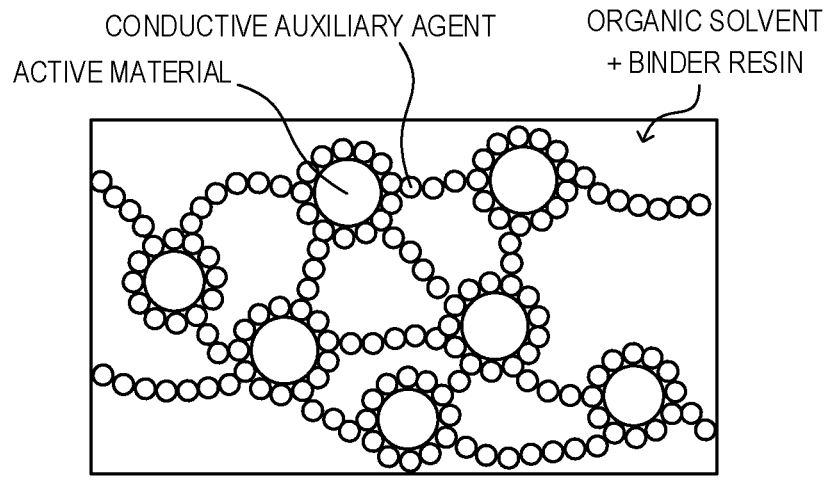
FIG. 15 is a schematic view for explaining the state of the slurry in which both of the homogeneity and the conductivity are excellent.
Figure 16:
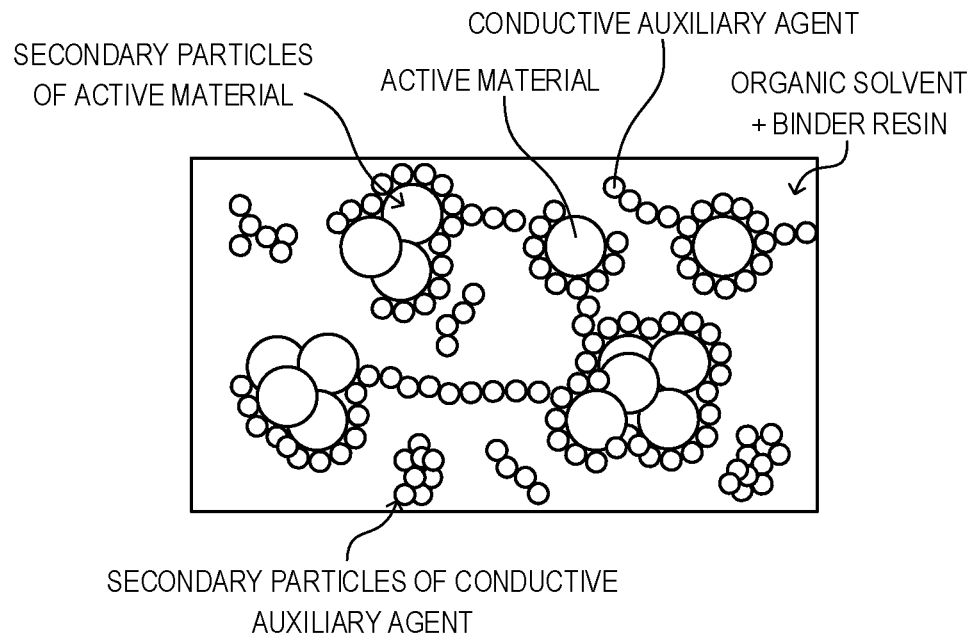
FIG. 16 is a schematic view for explaining the state of the slurry in which the homogeneity is not excellent, but the conductivity is excellent.
Figure 17:
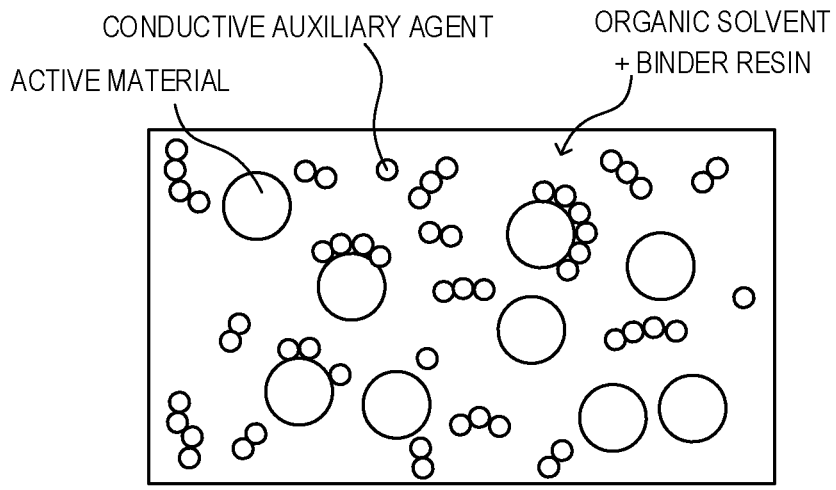
FIG. 17 is a schematic view for explaining the state of the slurry in which the homogeneity is excellent, but the conductivity is not excellent.
Figure 18:
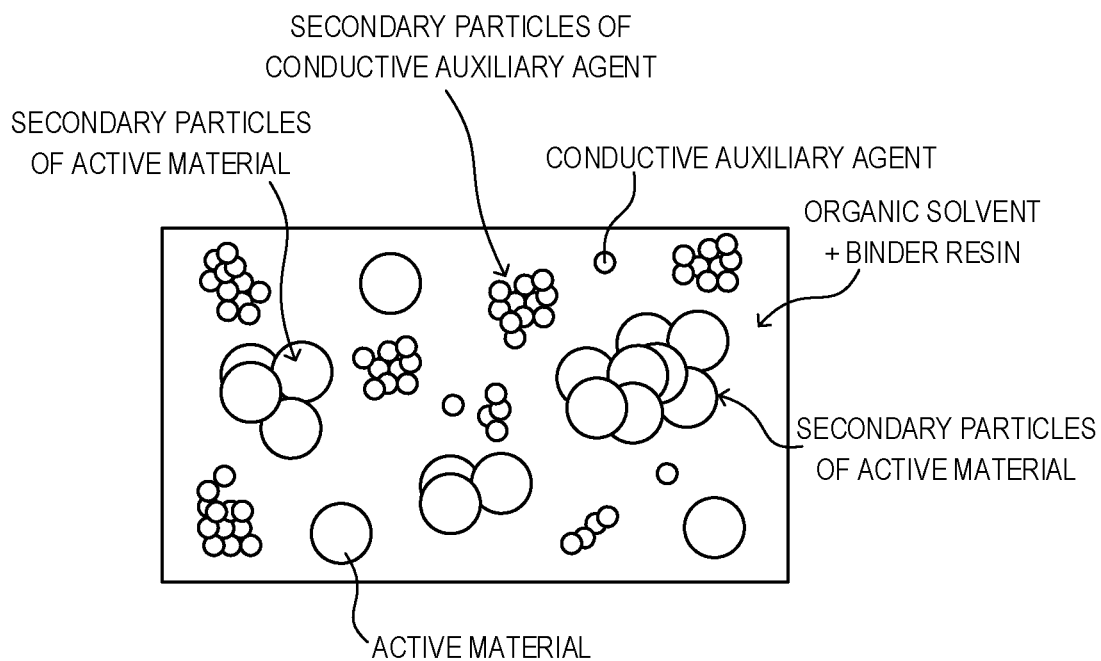
FIG. 18 is a schematic view for explaining the state of the slurry in which both of the homogeneity and the conductivity are not excellent.

FIGS. 15 to 18 are schematic views for explaining the state of the slurry, and are schematic views showing the state in which the conductive auxiliary agent is dispersed in organic solvent containing binder resin. FIG. 15 is schematic view for explaining the state of the slurry in which both of the homogeneity and the conductivity are excellent, FIG. 16 is a schematic view for explaining the state of the slurry in which the homogeneity is not excellent, but the conductivity is excellent. In addition, FIG. 17 is a schematic view for explaining the state of the slurry in which the homogeneity is excellent, but the conductivity is not excellent, and FIG. 18 is a schematic view for explaining the state of the slurry in which both of the homogeneity and the conductivity are not excellent.

In the state shown in FIG. 15, the active material is suitably dispersed in the organic solvent as non-flocculated particles. In addition, the dispersed active materials are mutually connected by chains of non-flocculated particles of the conductive auxiliary agent, and thereby, electrically conductive paths are formed.

The state shown in FIG. 16 is the state in which a part of the active material forms the secondary particles, and the electrically conductive paths are formed between non-flocculated particles of the active material or between the secondary particles of the active material by chains of the non-flocculated particles, secondary particles, or both of the conductive auxiliary agent. It is thought that the slurry at the initial stirring time is in such states.

In the state shown in FIG. 17, although the active material is dispersed as non-flocculated particles, the conductive auxiliary agent is also dispersed, and thus, the conductive paths sufficient to mutually connect the active materials are not formed. It is thought that the slurry at the later half of the stirring time is in such a state. It is thought that although such a slurry has the excellent homogeneity, the electrically conductive paths are less likely to be formed, and therefore, the electric characteristic is shown to be low.

In the state shown in FIG. 18, a part of the active material forms the secondary particles, and a part of the conductive auxiliary agent also forms the secondary particles. It is thought that soon after the stirring is started, the slurry is in such a state.

If the stirring time is suitably set, it is thought that the slurry reaches the state shown in FIG. 15. Such a slurry has both excellent homogeneity and conductivity.

As described above, with the measurement using the state determination apparatus 1, it has become possible to acquire both of the physical characteristic and the electric characteristic of the slurry, and therefore, for the homogeneity and the conductivity of the slurry, it has become possible to manage the conditions capable of adjusting the balance between the homogeneity and the conductivity in accordance with an aim therefor.

In addition, with the state determination apparatus 1 according to this embodiment, because it is possible to easily derive the index for specifying the electric characteristic and the index for specifying the physical characteristic, it is useful in the field in which the management of a quality of the mixture such as the slurry is required.

The present application claims a priority based on Japanese Patent Application 2020-133419 filed with the Japan Patent Office on Aug. 5, 2020, the entire content of which is incorporated into this specification by reference.

EXPLANATION OF REFERENCE 1 state determination apparatus
2 electrode
3 determination apparatus main body
31 measurement unit
32 storage unit
33 operating unit
34 display unit
35 processing unit
111 analysis setting module
112 impedance acquisition module
113 complex plane impedance data generating module
114 equivalent circuit analysis module
115 derivation module
121 setting unit
122 parameter calculating unit

What is claimed is:

1. A state determination apparatus comprising:
electrodes configured to apply an AC signal to a mixture, wherein the mixture is to be used as a positive electrode or a negative electrode, wherein the mixture includes a liquid and an insoluble solid matter mixed in the liquid;
a measurement unit configured to measure an impedance of the mixture for every frequency of the AC signal based on a response signal flowing through the mixture when the AC signal is applied to the mixture by the electrodes;
a setting unit configured to set an equivalent circuit corresponding to the mixture, wherein the equivalent circuit includes a series circuit that is obtained by serially connecting one or a plurality of first parallel circuit(s) based on element(s) corresponding to an internal resistance component of the solid matter and one or a plurality of second parallel circuit(s) based on element(s) corresponding to a contact resistance component between the solid matter;
a calculating unit configured to calculate a parameter of the first and second parallel circuits by executing an equivalent circuit analysis for approximating impedance of the equivalent circuit to the impedance of the mixture; and
a derivation unit configured to derive an index for specifying the state of the mixture based on the parameter of the first and second parallel circuits, wherein the index specifies a homogeneity of the mixture.

2. The state determination apparatus according to claim 1, wherein the first and second parallel circuits include at least one of a parallel circuit formed of a resistor and a capacitor, and a parallel circuit formed of the resistor and a constant phase element.

3. The state determination apparatus according to claim 1, wherein the derivation unit is configured to derive the homogeneity of the mixture based on at least one value of a resistance value, an electrostatic capacitance of a capacitor, and a constant phase element (CPE) index p of the first and second parallel circuits.

4. The state determination apparatus according to claim 1, wherein the derivation unit is configured to derive conductivity of the mixture based on at least one value of a resistance value, an electrostatic capacitance of a capacitor, a constant phase element (CPE) constant T, and a CPE index p of the first and second parallel circuits.

5. The state determination apparatus according to claim 1, wherein
the mixture contains a plurality of types of the solid matter mixed in the mixture including a first solid matter and a second solid matter,
the series circuit is formed by serially connecting:
a parallel circuit of the one or the plurality of first parallel circuit(s) corresponding to an internal resistance component of the first solid matter;
a parallel circuit of the one or the plurality of second parallel circuit(s) corresponding to a contact resistance component between the first solid matter;
a parallel circuit of the one or the plurality of first parallel circuit(s) corresponding to an internal resistance component of the second solid matter;
a parallel circuit of the one or the plurality of second parallel circuit(s) corresponding to a contact resistance component between the second solid matter; and
a parallel circuit of the one or the plurality of second parallel circuit(s) corresponding to a contact resistance component between the first solid matter and the second solid matter.

6. The state determination apparatus according to claim 1, wherein
the setting unit is configured to set a number of the first and second parallel circuits to be equal to or less than a total number of the internal resistance component and the contact resistance component of the solid matter in the mixture.

7. The state determination apparatus according to claim 1, wherein
the mixture contains a plurality of types of the solid matter mixed in the mixture,
the derivation unit is configured to derive an index for specifying the state of the mixture based on a value given by mutually composing at least one parameter among a resistor, a capacitor, and a constant phase element in a third parallel circuit of the first and second parallel circuits, the third parallel circuit corresponding to internal resistance components of the plurality of types of the solid matter, or the third parallel circuit corresponding to contact resistance components of the plurality of types of solid matter.

8. The state determination apparatus according to claim 1, wherein
the positive electrode or the negative electrode is for lithium ion battery, the slurry being formed by mixing an active material, a binder, and a conductive auxiliary agent as the solid matter.

9. A state determination method comprising:
a step of applying an AC signal to a mixture while changing a frequency of the AC signal, wherein the mixture is to be used as a positive electrode or a negative electrode, wherein the mixture includes a liquid and an insoluble solid matter mixed in the liquid;
a step of measuring an impedance of the mixture for every frequency of the AC signal based on a response signal flowing through the mixture when the AC signal is applied to the mixture;
a step of obtaining an equivalent circuit corresponding to the mixture, wherein the equivalent circuit includes a series circuit that is obtained by serially connecting one or a plurality of first parallel circuit(s) based on element(s) corresponding to an internal resistance component of the solid matter and one or a plurality of second parallel circuit(s) based on element(s) corresponding to a contact resistance component between the solid matter;
a step of calculating a parameter of the first and second parallel circuits by executing an equivalent circuit analysis for approximating impedance of the equivalent circuit to the impedance of the mixture; and
a step of deriving an index for specifying the state of the mixture based on the parameter of the first and second parallel circuits, wherein the index specifies a homogeneity of the mixture.

10. A storage medium in which a program causing a computer to execute a state determination method comprising:
a step of applying an AC signal to a mixture while changing frequency of the AC signal mixture, wherein the mixture is to be used as a positive electrode or a negative electrode, wherein the mixture includes a liquid and an insoluble solid matter mixed in the liquid;
a step of measuring an impedance provided for every frequency of the AC signal based on a response signal flowing through the mixture when the AC signal is applied to the mixture;
a step of obtaining an equivalent circuit corresponding to the mixture, wherein the equivalent circuit includes a series circuit that is obtained by serially connecting one or a plurality of first parallel circuit(s) based on element(s) corresponding to an internal resistance component of the solid matter and one or a plurality of second parallel circuit(s) based on element(s) corresponding to a contact resistance component between the solid matter;
a step of calculating a parameter of the first and second parallel circuits by executing an equivalent circuit analysis for approximating impedance of the equivalent circuit to the impedance of the mixture; and
a step of deriving an index for specifying the state of the mixture based on the parameter of the first and second parallel circuits, wherein the index specifies a homogeneity of the mixture.

11. The state determination apparatus according to claim 1, wherein
the mixture contains a plurality of types of the solid matter mixed in the mixture,
the setting unit is configured to set the first and second parallel circuits to include a plurality of parallel circuits that corresponds to an internal resistance component of the plurality of types of the solid matter respectively, a contact resistance component between the same types of the plurality of types of the solid matter, and a contact resistance component between different types of the plurality of types of the solid matter.

12. The state determination apparatus according to claim 11, wherein
the setting unit is configured to set a number of the first and second parallel circuits to be equal to or less than the number of all resistance components of the solid matter.

13. The state determination apparatus according to claim 1, wherein the index further specifies a conductivity of the mixture.

14. The state determination method according to claim 9, wherein the index further specifies a conductivity of the mixture.

15. The storage medium according to claim 10, wherein the index further specifies a conductivity of the mixture.

* * * * *